United States Patent
Tomono et al.

(10) Patent No.: US 7,214,561 B2
(45) Date of Patent: May 8, 2007

(54) PACKAGING ASSEMBLY AND METHOD OF ASSEMBLING THE SAME

(75) Inventors: Akira Tomono, Yokohama (JP); Soichi Homma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/902,055

(22) Filed: Jul. 30, 2004

(65) Prior Publication Data

US 2005/0006789 A1    Jan. 13, 2005

Related U.S. Application Data

(62) Division of application No. 10/693,083, filed on Oct. 27, 2003, now abandoned.

(30) Foreign Application Priority Data

Jun. 16, 2003   (JP)   ............ P2003-170905

(51) Int. Cl.
*H01L 21/00*   (2006.01)
(52) U.S. Cl. .......... 438/106; 438/108; 438/612; 257/778; 257/779; 257/780
(58) Field of Classification Search ........ 438/106
See application file for complete search history.

(56) References Cited

U.S. PATENT DOCUMENTS

2002/0149117 A1* 10/2002 Shibata .............. 257/777

2004/0155358 A1* 8/2004 Iijima .............. 257/778

FOREIGN PATENT DOCUMENTS

| JP | 8-064717 | 3/1996 |
|---|---|---|
| JP | 10-294337 | 11/1998 |
| JP | 10-321755 | 12/1998 |
| JP | 2000-082716 | 3/2000 |
| JP | 2001-298051 | 10/2001 |
| JP | 2002-016211 | 1/2002 |
| JP | 2002-241469 | 8/2002 |
| WO | WO 02/44241 A1 | 6/2002 |

OTHER PUBLICATIONS

Notice of Grounds for Rejection issued by the Japanese Patent Office on Aug. 17, 2005, for Japanese Application No. 2003-170905, and English-language translation thereof.

* cited by examiner

*Primary Examiner*—Carl Whitehead, Jr.
*Assistant Examiner*—Colleen E. Rodgers
(74) *Attorney, Agent, or Firm*—Finnegan, Henderson, Farabow, Garrett & Dunner, L.L.P.

(57) ABSTRACT

A packaging assembly includes a substrate; chip-site lands disposed on the first surface; first solder balls connected to the chip-site lands; second solder balls connected to the first solder balls including solder materials having higher melting temperatures than the first solder balls; a semiconductor chip having a plurality of bonding pads connected to the second solder balls on a surface of the semiconductor chip; and an underfill resin disposed around the first and second solder balls.

6 Claims, 17 Drawing Sheets

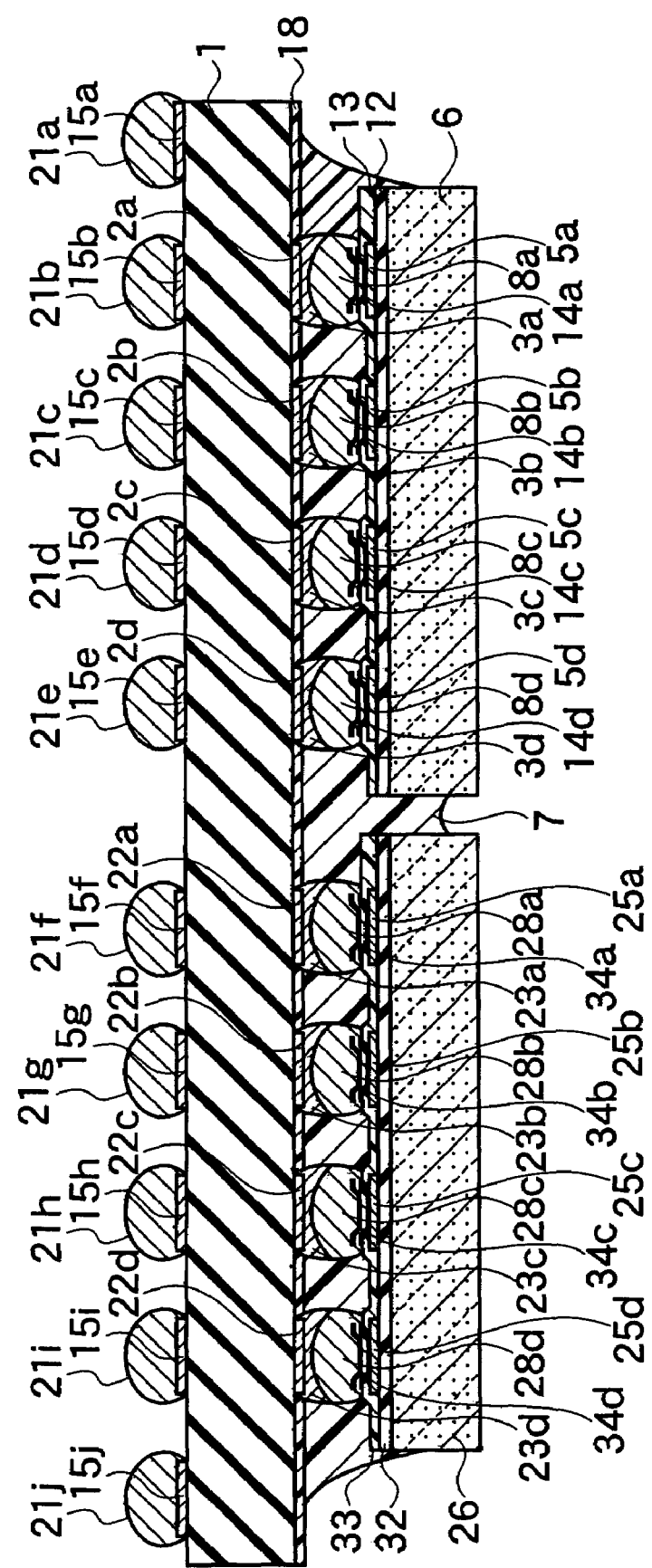

PACKAGING ASSEMBLY AND METHOD OF ASSEMBLING THE SAME

CROSS REFERENCE TO RELATED APPLICATIONS

This is a division of application Ser. No. 10/693,083, filed Oct. 27, 2003 now abandoned, which is incorporated, herein by reference.

This application is based upon and claims the benefit of priority from the prior Japanese Patent Applications No. P2003-170905, filed on Jun. 16, 2003; the entire contents of which are incorporated herein by reference.

BACKGROUND OF THE INVENTION

1. Field of the Invention

The present invention relates to semiconductor device technology, more specifically to a packaging assembly and a method of assembling a packaging assembly using soldering technology.

2. Description of the Related Art

Semiconductor integrated circuits such as LSI have achieved higher levels of integration in recent years. Semiconductor devices themselves are shrinking in geometrical size, increasing in the degree of on-chip integration, and number of pin-counts are increasing. As for the surface-mount package (SMP), flip chip bonding technology which connects a semiconductor chip and a circuit board with bumps has been employed widely. As for the flip chip bonding technology, an encapsulating resin is applied on a surface of a circuit board having bumps on the surface. Next, bumps formed on an element side of a semiconductor chip and the bumps formed on the circuit board are mated and contacted to each other. Furthermore, the circuit board and the semiconductor chip are heated around 150° C. during a reflow process, and oxide films and alien substances contained in the bumps are removed by the resin which serves as a flux. Then, bumps of the circuit board and the semiconductor chip are melted and connected during heating process at 200° C. After that, bumps and the resin are hardened completely in the curing process.

In the SMP assembling process, solder bumps made of solder paste are often used as bump electrodes. However, recently, it has been pointed out that the outflow of lead from electronic products dumped onto reclaimed land pollutes underground water. Thus, throughout the world, manufacturers are changing the Sn—Pb eutectic, used for mounting semiconductor chips or printed circuit boards, to lead-free solder alloys.

Material examples of lead-free solder alloys, responding to an environmental problem, are tin-silver (Sn—Ag) solder and tin-zinc (Sn—Zn) solder. However, for lead-free solder alloys such as Sn—Ag solder, the melting temperature is generally higher than that of the conventional eutectic alloy. Therefore, lead-free solder alloys having higher melting temperatures have to be reflowed at a relatively high temperature of approximately 200° C. However, when reflow is performed at high temperature conditions, strong thermal stresses are applied to semiconductor chips and mounting bases, and an aggravation of coplanarity and a fall in reliability occurs. Moreover, when organic materials are employed as a circuit board, a gas is generated from the circuit board and that invades into an underfill resin by reflowing at a high temperature of more than 200° C. On the other hand, while a curing reaction advances for the underfill resin, the viscosity of the underfill resin rises. As a result, the gas in the underfill resin remains as a void without being ejected outside of the underfill resin. Furthermore, since the heat shrinkage rate of underfill resin also increases by reflowing, thermal stresses occur to the electrodes on the semiconductor element side, and cracks in the electrodes arise.

Meanwhile, since recent microprocessors process huge quantities of information at high speed, there have been problems with the resistance of wires interconnecting transistors, and the capacitances of insulators between interconnect wires. For example, wire materials are changing from aluminum (Al) to copper (Cu) having a high electrical conductivity, and insulators are changing from silicon oxide films to materials having low dielectric constants. However, such materials used in recent electronic devices are generally weak in mechanical strength. In particular, low dielectric constant films (hereinafter called low-k films) used as insulators on semiconductor chips are significantly weak in mechanical strength and in adhesion intensity because of their porous structures necessary to ensure low dielectric constants. Therefore, when reflowing to electrodes is performed using a lead-free solder at a high melting temperature, strong thermal stresses also occur in the low-k films within the semiconductor chip. Furthermore, the low-k films disposed just under the solder electrodes may be damaged by the heat and the adhesive strength between the semiconductor chip and the mounting base is also decreased.

SUMMARY OF THE INVENTION

An aspect of the present invention inheres in a packaging assembly embracing a substrate defined by a first surface and a second surface opposing to the first surface; a plurality of chip-site lands disposed on the first surface; a plurality of first solder balls connected to the chip-site lands; a plurality of second solder balls connected to the first solder balls including solder materials having higher melting temperatures than the first solder balls; a semiconductor chip having a plurality of bonding pads connected to the second solder balls on a surface of the semiconductor chip; and an underfill resin disposed around the first and second solder balls.

Another aspect of the present invention inheres in a method of assembling a packaging assembly embracing preparing a substrate having a plurality of chip-site lands disposed on the first surface of a substrate; disposing a plurality of first solder balls on the chip-site lands; applying an underfill resin around the chip-site lands and the first solder balls; disposing a plurality of second solder balls on corresponding bonding pads disposed on a semiconductor chip; aligning the first solder balls with corresponding second solder balls; connecting the first and second solder balls by melting the first solder balls; and hardening the underfill resin.

BRIEF DESCRIPTION OF DRAWINGS

FIGS. 19 and 20 are sectional views showing a modification of packaging assembly according to the second embodiment of the present invention.

DETAILED DESCRIPTION OF THE INVENTION

Figure 1:
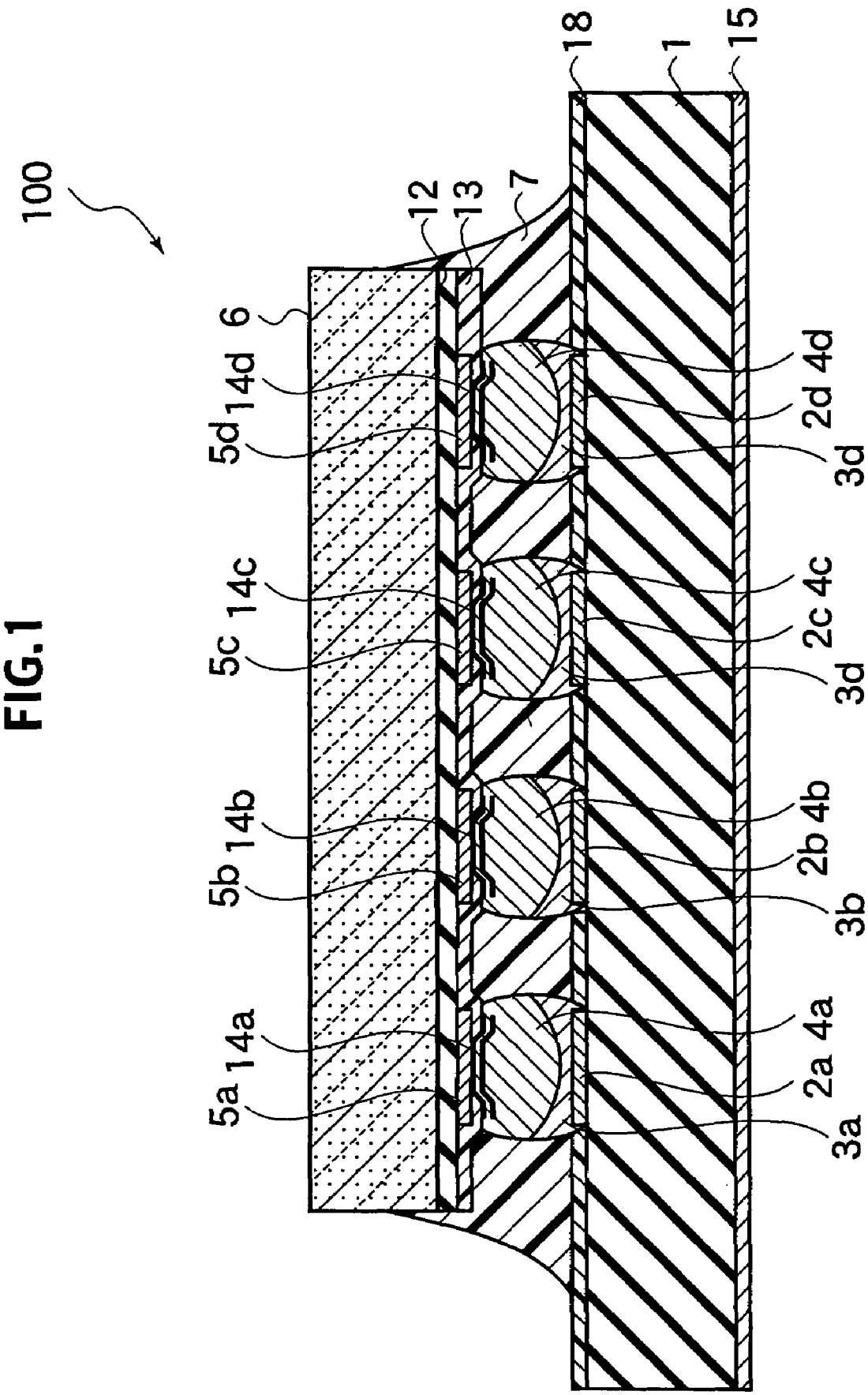
FIG. 1 is a sectional view showing an example of packaging assembly according to a first embodiment of the present invention.

With reference to the accompanying drawings, first and second embodiments of the present inventions are described. Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of semiconductor packaging assemblies, it will be appreciated that the various drawings are not drawn to scale from one figure to another nor inside a given figure, and in particular that the layer thicknesses are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details.

First Embodiment

The packaging assembly 100 according to a first embodiment of the present invention encompasses, as shown in FIG. 1, a substrate 1 defined by a first surface and a second surface opposing to the first surface, a plurality of chip-site lands 2a, 2b, 2c, and 2d disposed on the first surface, a plurality of first solder balls 3a, 3b, 3c, and 3d connected to the chip-site lands 2a, 2b, 2c, and 2d, a plurality of a second solder balls 4a, 4b, 4c, and 4d connected to the first solder balls 3a, 3b, 3c, and 3d, a semiconductor chip 6 connected to the second solder balls 4a, 4b, 4c, and 4d on a third surface, and an underfill resin 7 disposed around the first solder balls 3a, 3b, 3c, and 3d and second solder balls 4a, 4b, 4c, and 4d. The underfill resin 7 also serves as a flux.

The substrate 1 is a kind of printed circuit board made from a material including epoxy resin. The substrate 1 has: a wiring layer 15 on a second surface, a plurality of chip-site lands 2a, 2b, 2c, and 2d on a first surface, and a protective film (passivation layer) 18 which is made from $SiO_2$ film, PSG film and the like. The protective film 18 is stacked on the chip-site lands 2a, 2b, 2c, and 2d. As the material of the substrate 1, various organic synthetic resins and inorganic materials including ceramic and glass can be used. Among organic synthetic resins, phenolic resin, polyester resin, epoxy resin, polyimide resin, fluoroplastic, and the like can be used. Meanwhile, paper, woven glass fabric, a glass backing material, or the like is used as a backing material that becomes a core in forming a slab-shaped structure. As a general inorganic base material, ceramic can be used. Alternatively, a metal substrate is used in order to improve the heat-radiating characteristics. In the case where a transparent substrate is needed, glass is used. As a ceramic substrate, alumina ($Al_2O_3$), mullite ($3Al_2O_3 \cdot 2SiO_2$), beryllia (BeO), aluminum nitride (AlN), silicon nitride (SiN), and the like can be used. Furthermore, it is possible to use a metal insulator substrate in which a polyimide resin plate having high thermal resistance is laminated onto metal, such as iron or copper, to form a multi-layered structure. The thickness of the substrate 1 is not limited. As for the chip-site lands 2a, 2b, 2c, and 2d, and the wiring layer 15, electrically conductive material such as aluminum (Al,) aluminum alloy (Al—Si, Al—Cu—Si), gold, copper, or the like can be used. Alternatively, other electrodes can be provided through a plurality of signal lines such as gate wires connected to a plurality of gate electrodes. As gate electrodes, it is possible to use polysilicon, refractory metal such as tungsten (W), titanium (Ti), and molybdenum (Mo), silicides thereof ($WSi_2$, $TiSi_2$ and $MoSi_2$), polycide using these silicides, or the like. Alternatively, inside of the substrate 1, a plurality of vias can be formed and a plurality of inner buried wires connected to the vias can be disposed.

The chip-site lands 2a, 2b, 2c, and 2d are aligned at equal intervals on the first surface of the substrate 1. The positions, material, number, and the like of the chip-site lands 2a, 2b, 2c, and 2d are not limited. The first solder balls 3a, 3b, 3c, and 3d are connected on the chip-site lands 2a, 2b, 2c, and 2d. For the first solder balls 3a, 3b, 3c, and 3d, solder materials having lower melting temperature can be used. As for the first solder balls 3a, 3b, 3c and 3d, materials selected from a tin-bismuth (Sn—Bi) alloy, tin-bismuth-silver (Sn—Bi—Ag) alloy, tin-zinc (Sn—Zn) alloy, tin-zinc-bismuth (Sn—Zn—Bi) alloy, tin-bismuth-indium (Sn—Bi—In) alloy, bismuth-indium (Bi—In) alloy, bismuth-palladium (Bi—Pd) alloy, indium-silver (In—Ag) alloy, tin-lead (Sn=5 w %, Pb=95 w %) can be used. Melting temperatures of a these alloys are as follows: Sn—Pb alloy and a Sn—Bi—Ag alloy are from 138° C. to 150° C., Sn—Zn alloy is from 198° C. to 210° C., Sn—Bi—In alloy is from 190° C. to 200° C., Bi—In alloy is from 72° C. to 120° C., Sn—In alloy is from 116° C. to 130° C., In—Ag alloy is from 141° C. to 160° C., Sn—Pb (Sn=5 w %, Pb=95 w %) alloy is from 320° C. to 330° C. In case where the outflow of lead to the environment is taken into consideration, lead-free solders having lower melting temperatures may be used for the first solder balls 3a, 3b, 3c, and 3d. For example, when a material such as an organic synthetic resin is used for the substrate 1, solder materials having lower melting temperature such as Sn—Bi alloy and Sn—Bi—Ag alloy can be used to prevent gas generation from the substrate. The top surface of the first solder balls 3a, 3b, 3c and 3d are taking a concave shape on the chip-site lands 2a, 2b, 2c and 2d. The second solder balls 4a, 4b, 4c and 4d taking spherical shapes are adhered on the top surface of the concave-shaped balls (first solder balls) 3a, 3b, 3c, and 3d.

As shown in FIG. 1, the second solder balls 4a, 4b, 4c and 4d are connected to the bonding pads 5a, 5b, 5c, and 5d disposed on the third surface of the semiconductor chip 6. As for the second solder balls 4a, 4b, 4c, and 4d, solder materials having higher melting temperature than the first solder balls 3a, 3b, 3c, and 3d may be used. As for the second solder balls 4a, 4b, 4c, and 4d, materials selected from a tin-silver (Sn—Ag) alloy, tin-silver-copper (Sn—Ag—Cu) alloy, tin-lead (Sn=63 w % Pb=35 w %) alloy, tin-zinc (Sn—Zn) alloy can be used. Melting temperatures of these alloys are as follows: a Sn—Ag alloy is from 220° C. to 225° C., Sn—Ag—Cu alloy is from 215° C. to 230° C., Sn—Pb (Sn=63 w % Pb=35 w %) alloy is from 180° C. to 185° C., Sn—Zn alloy is from 195° C. to 215° C. Materials of the second solder balls 4a, 4b, 4c, and 4d may be changed depending on the melting temperature of the material used for the first solder balls 3a, 3b, 3c, and 3d. For example, when materials containing lead are used as solder balls, Sn—Pb alloys composed of 5 w % tin and 95 w % lead can be used as the first solder balls 3a, 3b, 3c and 3d and Sn—Pb alloys composed of 63 w % tin and 37 w % of lead can be used as the second solder balls 4a, 4b, 4c, and 4d. On the other hand, if the outflow of the lead to the environment is taken into consideration, lead-free solders having lower melting temperature may be useful for the second solder balls 4a, 4b, 4c, and 4d. For example, Sn—Bi alloys may be used as the first solder balls 3a, 3b, 3c, and 3d, and Sn—Ag alloys may be used as the second solder balls 4a, 4b, 4c, and 4d.

Figure 1A:
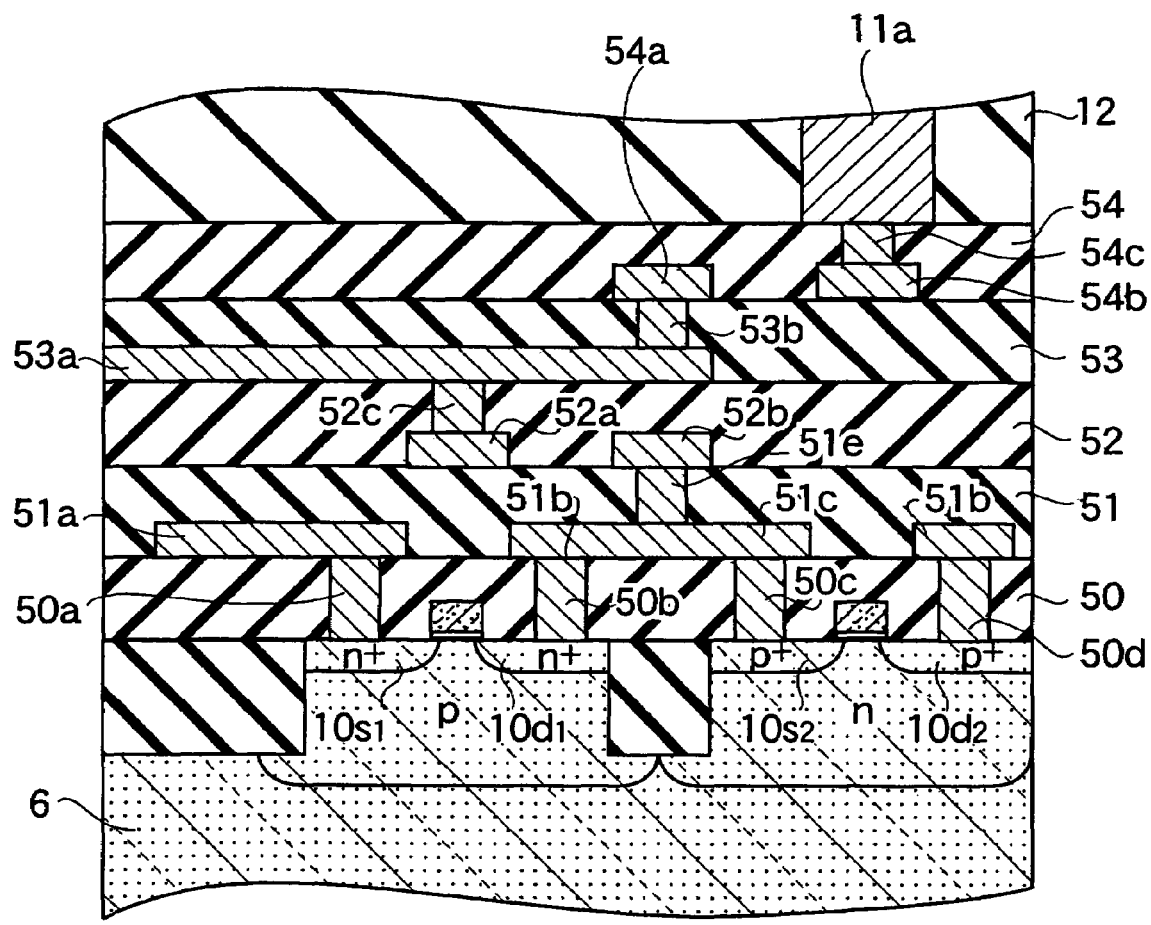
FIG. 1A is an enlarged view showing an example of a third surface of a semiconductor chip shown in FIG. 1.

As shown in FIG. 1A, a plurality of semiconductor elements (circuit elements) $10s_1$, $10s_2$, $10d_1$, and $10d_2$, which are heavily-doped impurity regions doped with donors or acceptors of approximately $1 \times 10^{18}$ cm$^{-3}$ to $1 \times 10^{21}$ cm$^{-3}$ (such as source regions $10s_1$ and $10s_2$ and drain regions $10d_1$ and $10d_2$ or emitter regions/collector regions) or the like are merged on the third surface of the semiconductor chip 6. Insulating films 50, 51, 52, 53, and 54, made from low-k films are stacked into a multi-level structure using low-k films on the semiconductor elements $10s_1$, $10s_2$, $10d_1$, and $10d_2$. Metallic interconnections 50a, 50b, 50c, 50d, 51a, 51b, 51c, 51d, 51e, 53a, 53b, 54a, 54b, and 54c made of aluminum (Al) aluminum alloy (Al—Si or Al—Cu—Si) or the like are alternatively stacked into the insulating films 50, 51, 52, 53, and 54 so as to connect the semiconductor elements $10s_1$, $10s_2$, $10d_1$, and $10d_2$. On the uppermost layer of the insulating films 54, low-k films 12 as shown in FIG. 1 can be stacked into multi-level structure. As shown in FIG. 1, bonding pads 5a, 5b, 5c, and 5d are formed just under the low-k film 12. Note that, prepositions, such as "on" and "under" are defined with respect to a planar surface of the substrate, regardless of the orientation the substrate is actually held. As shown in FIG. 1, a protective film 13 made from a silicon oxide film (SiO$_2$), a PSG film, a BPSG film, a silicon nitride film (Si$_3$N$_4$), a polyimide film or the like is formed on the low-k film 12 and bonding pads 5a, 5b, 5c, and 5d and covers the third surface of the semiconductor chip 6. In the protective film 13, a plurality of openings (not shown in FIG. 1) are selectively provided so as to expose partially the top surface of the respective bonding pads 5a, 5b, 5c, and 5d. The barrier metals 14a, 14b, 14c, and 14d, which are connected to the second solder balls 4a, 4b, 4c, and 4d, are formed on the respective bonding pads 5a, 5b, 5c, and 5d. Note that, as for the low-k film 12, a material having an effective dielectric constant of the low-k film is equal to or less than 3.5 is desirable to accomplish lower effective dielectric constant between wirings. As for the low-k films, for example, an inorganic insulator such as fluorine doped silicon mono oxide (SiOF), carbon doped silicon mono oxide (SiOC), organic silica, porous HSQ, benzocycrobutene (BCB) and porous films made from above mentioned materials can be used. Moreover, to prevent exfoliation, it can be agreeable that the coherence strength of the insulating films 50, 51, 52, 53 and 54, and low-k film 12 to the circuit elements $10s_1$, $10s_2$, $10d_1$, and $10d_2$, metallic interconnections 50a, 50b, 50c, 50d, 51a, 51b, 51c, 51d, 51e, 53a, 53b, 54a, 54b, and 54c, and the semiconductor chip 6 is equal to or less than 15 J/m$^2$.

As the underfill resin 7, materials such as a resin containing flux, a stiffening material having capability of flux, a resin containing filler, and materials containing acid anhydrides can be used. As for the resin, epoxy resin, acrylic resin, silicon resin, polyimide resin and the like may be useful.

In the packaging assembly 100 according to the first embodiment of the present invention, the first solder balls 3a, 3b, 3c, and 3d are disposed on the substrate 1. These first solder balls 3a, 3b, 3c, and 3d are melted when heated at a lower temperature of approximately 150° C. Therefore, when an organic synthetic resin is used for a material of the substrate 1, because gas is not released from the substrate 1, voids are not generated in the underfill resin 7. Moreover, since the substrate 1 and the semiconductor chip 6 are connected at a low temperature of 150° C., the heat contraction of the substrate 1, semiconductor chip 6, and resin 7 can be minimized. At the same time, coplanarity and reliability of the substrate 1 may be improved. Furthermore, since strong thermal stress is not added to the second solder balls 4a, 4b, 4c, and 4d, the low-k film 12 disposed on the bonding pads 5a, 5b, 5c, and 5d does not break. The protective film 13 containing organic resins is disposed on the surface of the low-k film 12. Therefore, the low-k film 12 will not exfoliated. Furthermore, when lead-free solder materials are used for the first and second solder balls 4a, 4b, 4c, and 4d, 5a, 5b, 5c, and 5d respectively, the packaging assembly 100 corresponding to the environmental problem may be accomplished.

(First Assembling Method of the First Embodiment)

Next, as shown in FIGS. 2 to 10, a first assembling method of the packaging assembly 100 according to the first embodiment of the present invention is described. Here, it is obvious that the assembling method of the packaging assembly 100 described below is one example, and the packaging assembly 100 is feasible by other various assembly methods including modifications of the present embodiment.

Figure 2:
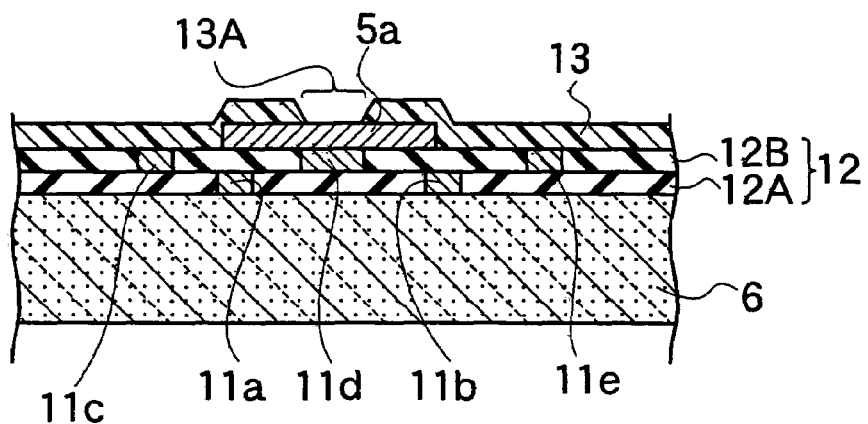
FIGS. 2 to 10 are sectional views showing a first example of assembling the packaging assembly according to the first embodiment of the present invention.

(a) First, the semiconductor chip having circuit elements, insulating films, and metallic interconnections on the third surface (omitted in FIG. 2) are prepared. Then, as shown in FIG. 2, a multi-level structure of low-k films 12A and 12B as interlayer dielectrics are stacked and metal wires 11a, 11b, 11c, 11d, and 11e made from Al, Al—Si, Al—Cu—Si, or the like are formed into the low-k films 12A and 12B are formed. In the uppermost conductive layer, the bonding pad 5a is formed. Next, a protective film 13 made from a SiO$_2$ film, a PSG film, a BPSG film, a Si$_3$N$_4$ film, a polyimide film, or the like is formed around the bonding pads 5a. Subsequently, the protection film 13 is partially provided with an opening 13A such that the bonding pad 5 is exposed.

Figure 3:
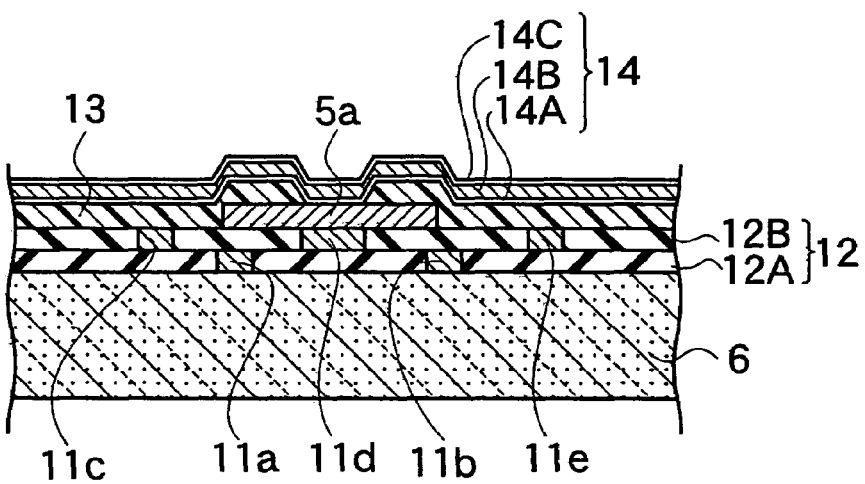
Figure 4:
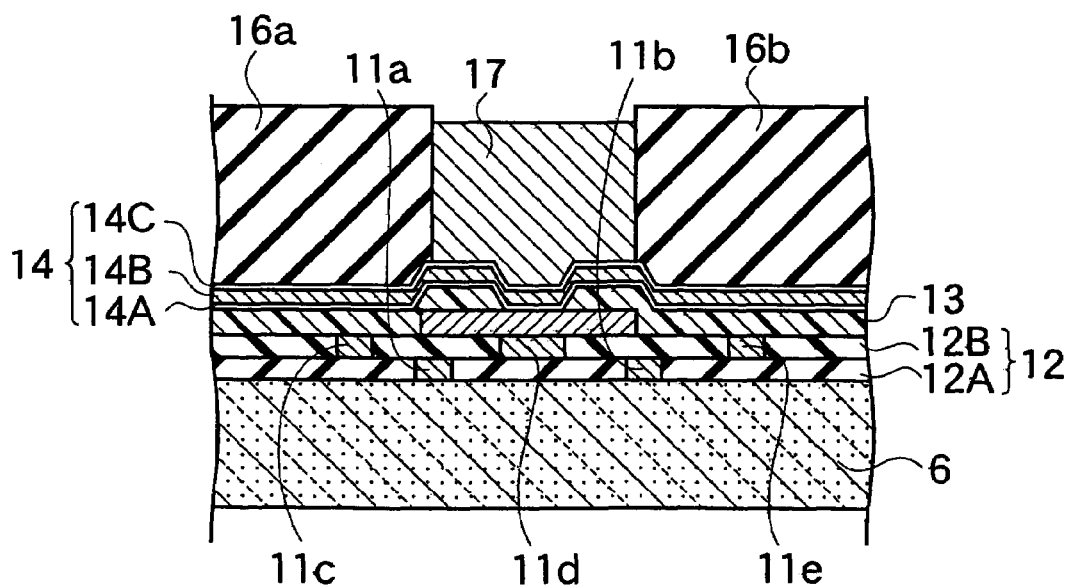

(b) Next, as shown in FIG. 3 the titanium (Ti) film 14A, nickel (Ni) film 14B on the Ti film 14A, and the Pd film 14C on the Ni film 14B are formed gradually by use of a sputtering equipment or an electron beam evaporation apparatus, a barrier metal film 14 is formed. Then, a photo resist film (not shown in FIG. 3) is applied onto the barrier metal 14, and a gap is formed between the photo resist films 16a and 16b. Next, as shown in FIG. 4, a conductive material 17 is selectively buried in the groove between the photo resist films 16a and 16b.

Figure 5:
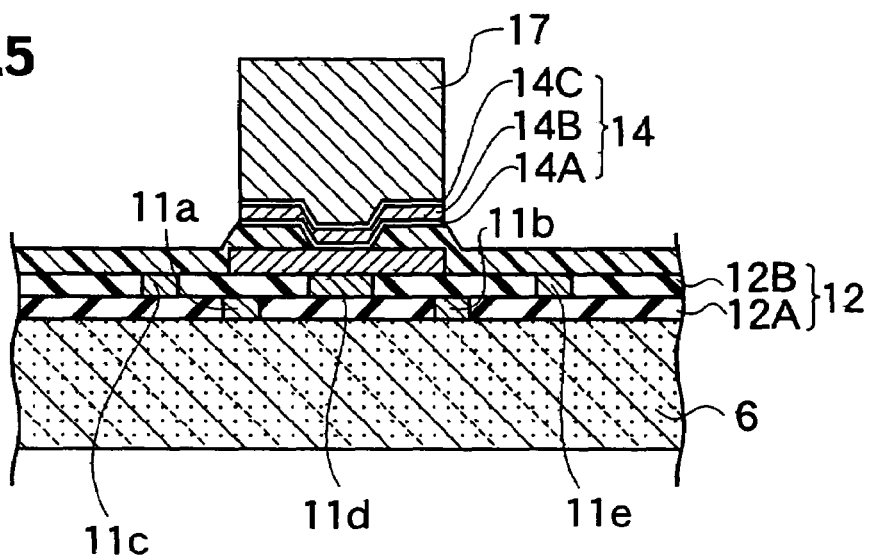
Figure 6:
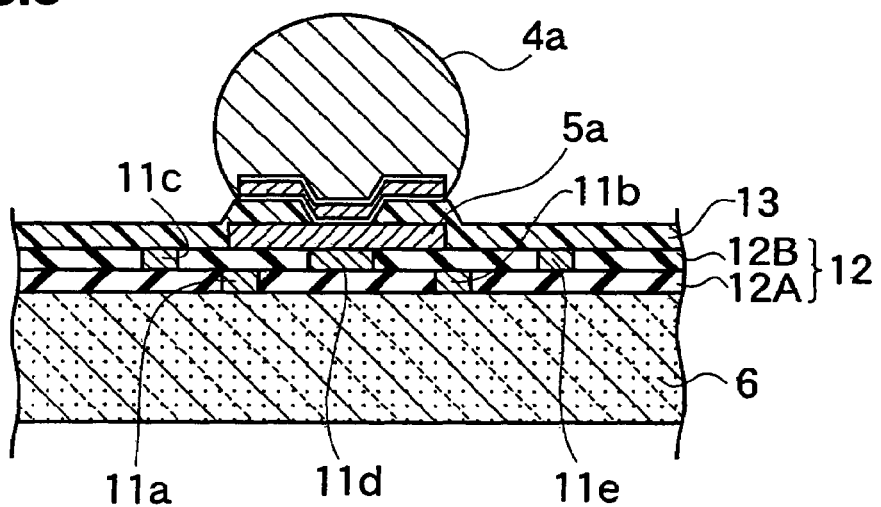

(c) Next, as shown in FIG. 5, the photo resist films 16a and 16b are stripped by solvents such as acetone, photo resist stripper and the like. Part of the Pd film 14C, Ni film 14B, and Ti film 14A are removed by use of the conductive material 14 as an etching mask. As for the removal of the Pd film 14C and Ni film 14B, an etching solution of aqua regia may be used. As for the removal of the Ti film 14A, an etching solution of ethylene diamine tetra-acetic acid may be used. Next, flux is applied around the conductive material 17, and the conductive material 17 is heated around 200° C.~220° C. for 30 minutes during a reflowing process. Then, as shown in FIG. 6, the second solder ball 4a is formed. After that, some electric testing may be performed to the semiconductor chip 6.

Figure 7:
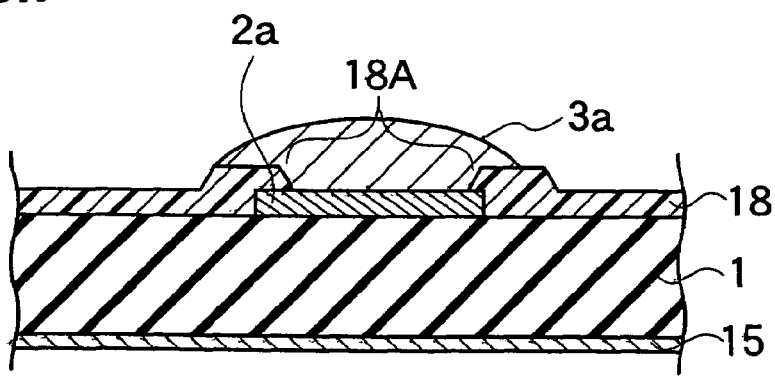

(d) Next, as shown in FIG. 7, the substrate 1 which is made from epoxy resin with a thickness of 30 μm~60 μm is prepared. As for the substrate 1, phenolic resin, polyester resin, epoxy resin, polyimide resin, fluoroplastic, and the like may be used instead of epoxy resin. A wiring layer 15 made from copper or the like is formed on the second surface of the substrate 1. On the first surface, the chip-site land 2a is formed and the protective film 18 made from $SiO_2$ film, PSG film or the like is laminated on the chip-site land 2a. Then, the protection film 18 is partially provided with an opening 18A such that the chip-site land 2a is exposed, thus forming the first solder ball 3a.

Figure 8:
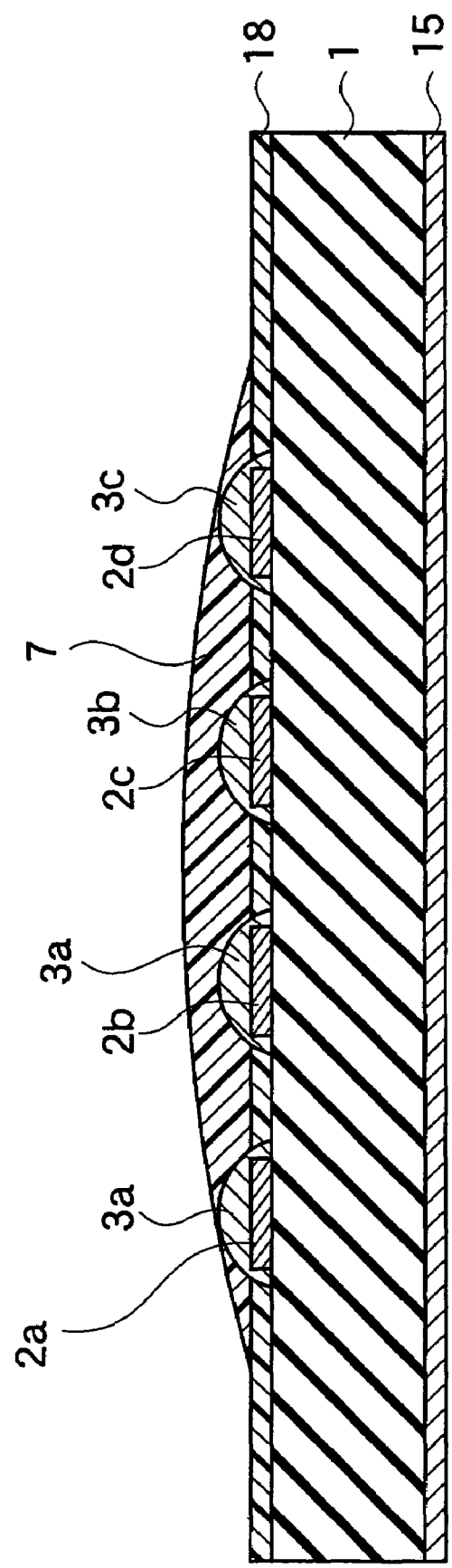
Figure 9:
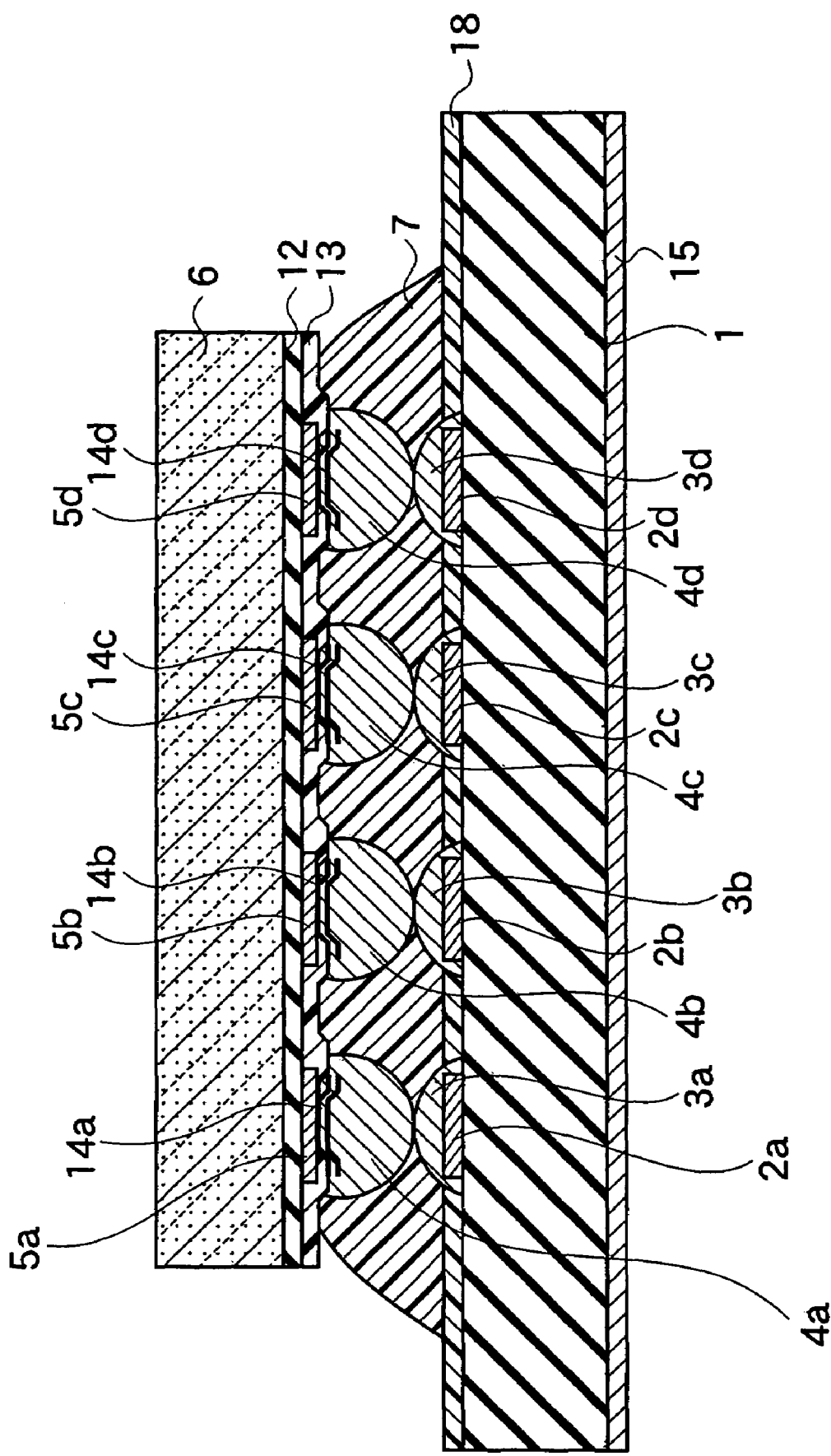
Figure 10:
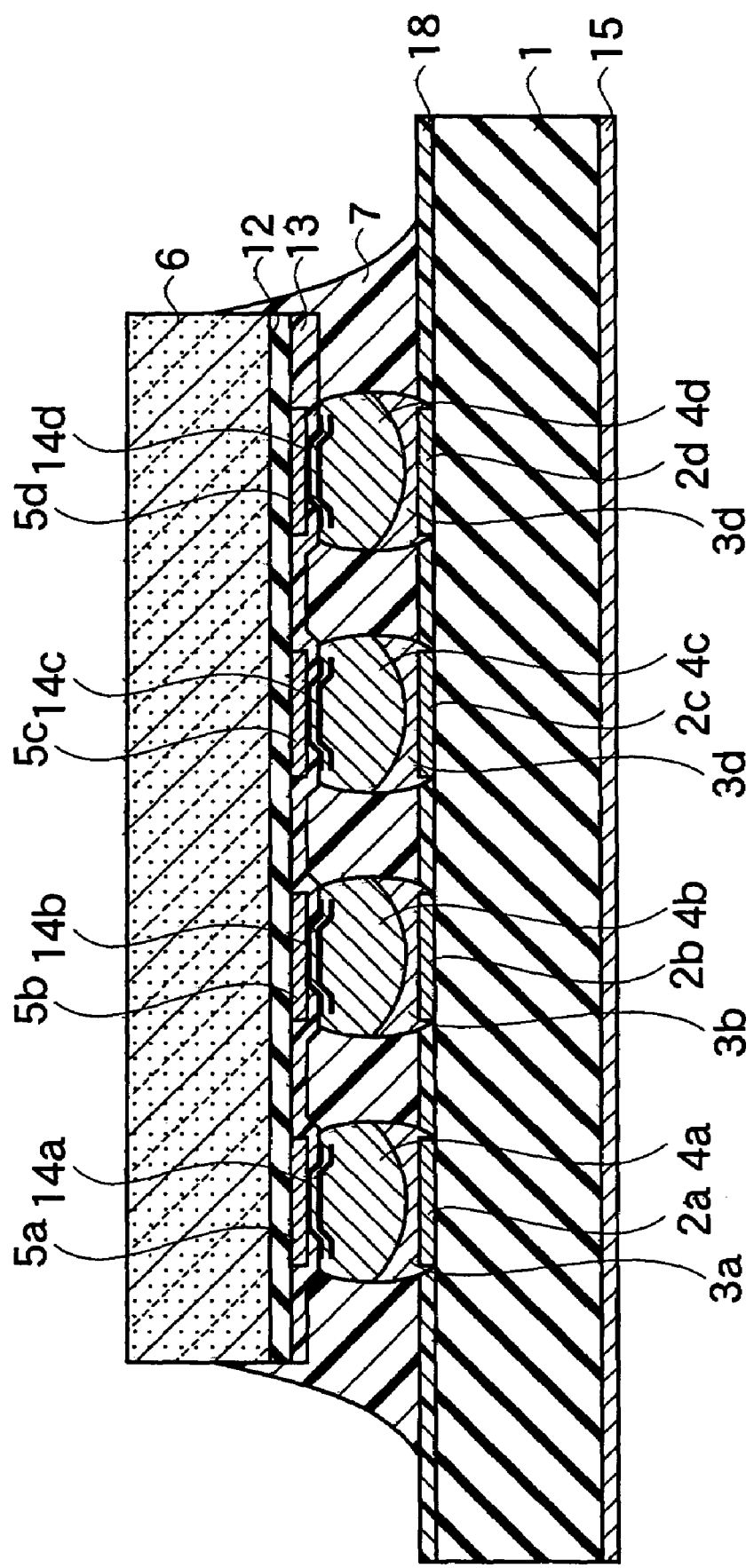

(e) Next, as shown in FIG. 8, underfill resin 7 having property of flux is applied on the second surface of the substrate 1 so as to surround the chip-site lands 2a, 2b, 2c, and 2d, and the first solder balls 3a, 3b, 3c, and 3d. Note that, a resin containing filler can be used as the underfill resin 7 to decrease the thermal expansion coefficient and to improve reliability. Then, as shown in FIG. 9, the second solder balls 4a, 4b, 4c, and 4d are aligned on the first solder balls 3a, 3b, 3c, and 3d so as to be mated each other. After that, the substrate 1 and the semiconductor chip 7 are introduced to a furnace or the like and reflow is performed for 1~15 seconds at about 150° C., pressurizing toward a substrate from upside of the semiconductor chip 6. As a result, since the underfill resin 7 is activated, oxides and impurities of the first solder balls 3a, 3b, 3c, and 3d are removed by the flux capability of the underfill resin 7. Next, the first solder balls 3a, 3b, 3c, and 3d are melted and adhered around the second solder balls 4a, 4b, 4c, and 4d, as shown in FIG. 10. Moreover, in order to harden the underfill resin 7, the substrate 1 and the semiconductor chip 6 are introduced to the oven and dried.

As described above, the packaging assembly 100 as shown in FIG. 1 can be assembled. According to the packaging assembly 100 of the first embodiment of the present invention, the first solder balls 3a, 3b, 3c and 3d disposed on the chip-site lands 2a, 2b, 2c, and 2d melt at a temperature of about 150° C. and connect temporarily to the second solder balls 4a, 4b, 4c, and 4d. Therefore, when an organic synthetic resin is used for a material of the substrate 1, gas will not be released from the substrate 1, and voids are not generated in the underfill resin 7. Moreover, since the substrate 1 and the semiconductor chip 6 are connected at a low temperature, the heat contraction of the substrate 1, semiconductor chip 6, and resin 7 can be minimized. At the same time, coplanarity and reliability of the substrate 1 may be improved. Furthermore, since strong thermal stress is not incurred to the second solder balls 4a, 4b, 4c, and 4d, the low-k film 12 disposed on the bonding pads 5a, 5b, 5c, and 5d will not break. The protective film 13 containing organic resin is disposed on the surface of the low-k film 12. Therefore, the low-k film 12 is not exfoliated.

(Second Assembling Method of the First Embodiment)

Figure 11:
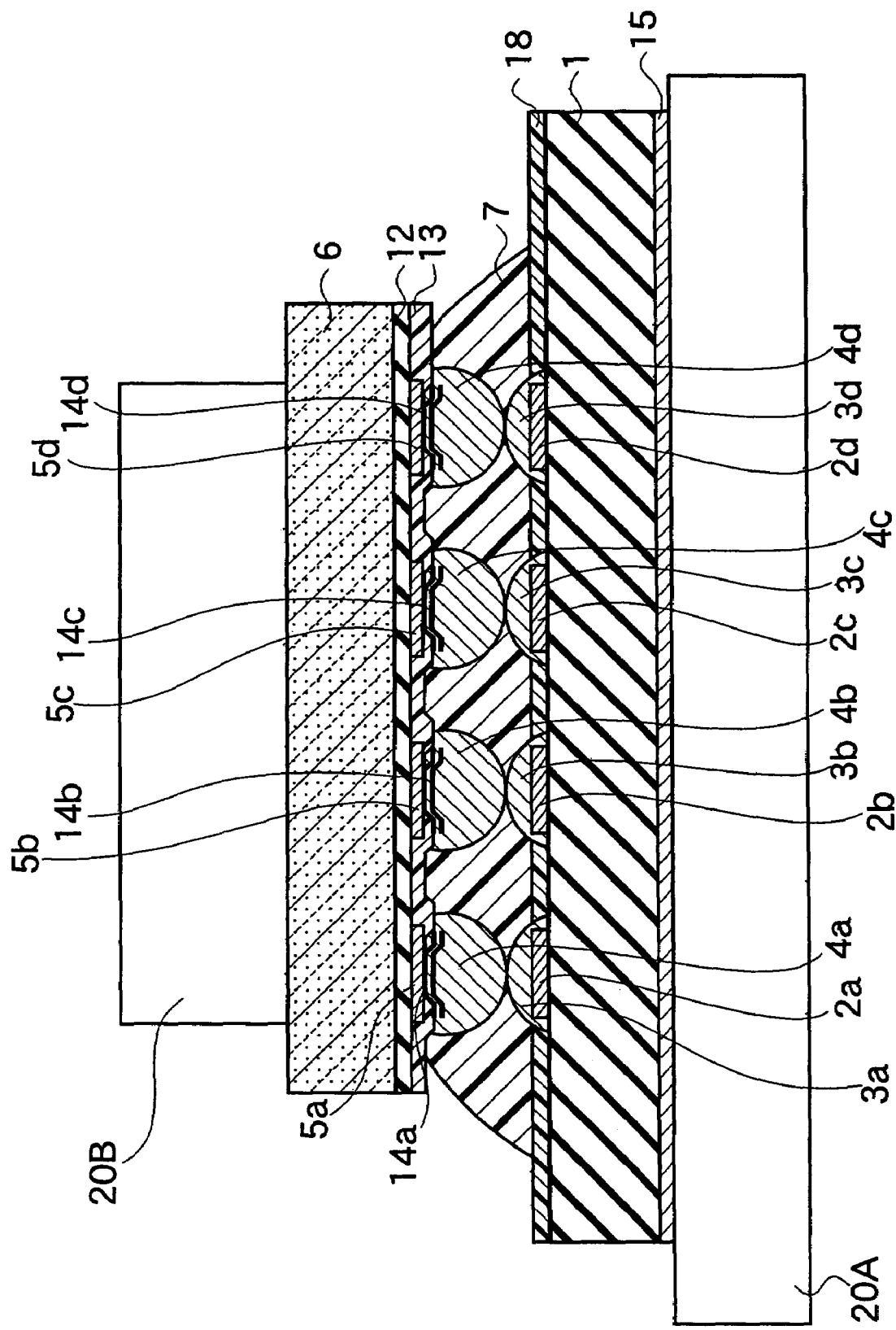
FIGS. 11 and 12 are sectional views showing a second example of assembling the packaging assembly according to the first embodiment of the present invention.
Figure 12:
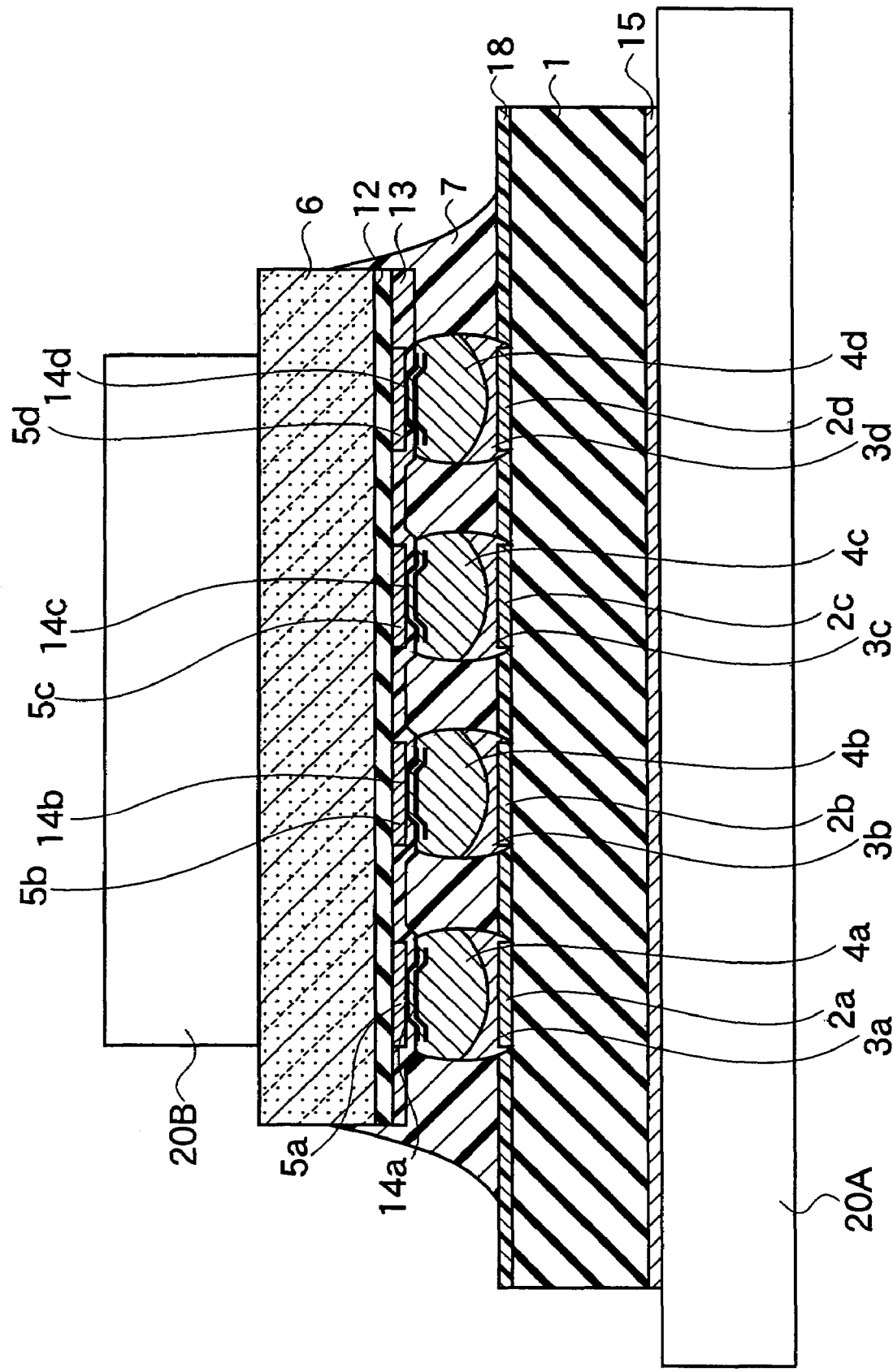

Next, as shown in FIGS. 11 and 12, a second assembling method of the packaging assembly 100 according to the first embodiment of the present invention is described. Here, since a sequence of the procedure of the second assembling method before forming the second solder balls 4a, 4b, 4c, and 4d on the semiconductor chip 6 or first solder balls 3a, 3b, 3c, and 3d on the substrate 1 is substantially the same shown in FIGS. 2~8, detailed explanation is omitted.

First, an assembling stage 20A and an assembling tool 20B are heated to around 150° C. Then, the second surface of the substrate 1 having first solder balls 2a, 2b, 2c, and 2d on the first surface is disposed on the assembling stage 20A by use of a vacuum wand and the like. A fourth surface of the semiconductor chip 6 having second solder balls 3a, 3b, 3c, and 3d on the third surface is fixed on the assembling tool 20B by use of the vacuum wand and the like. Next, as shown in FIG. 11, the second solder balls 4a, 4b, 4c, and 4d are aligned with the first solder balls 3a, 3b, 3c, and 3d so as to be mated each other. Then, the assembling stage 20A is pressurized by the assembling tool 20B. The first solder balls 3a, 3b, 3c, and 3d are melted and their shapes transformed, and are adhered to the second solder ball 4a, 4b, 4c, and 4d. Moreover, the assembling stage 20A and the assembling tool 20B are cooled, the underfill resin 7 is cooled and hardened.

(Modification of the First Embodiment)

Figure 13:
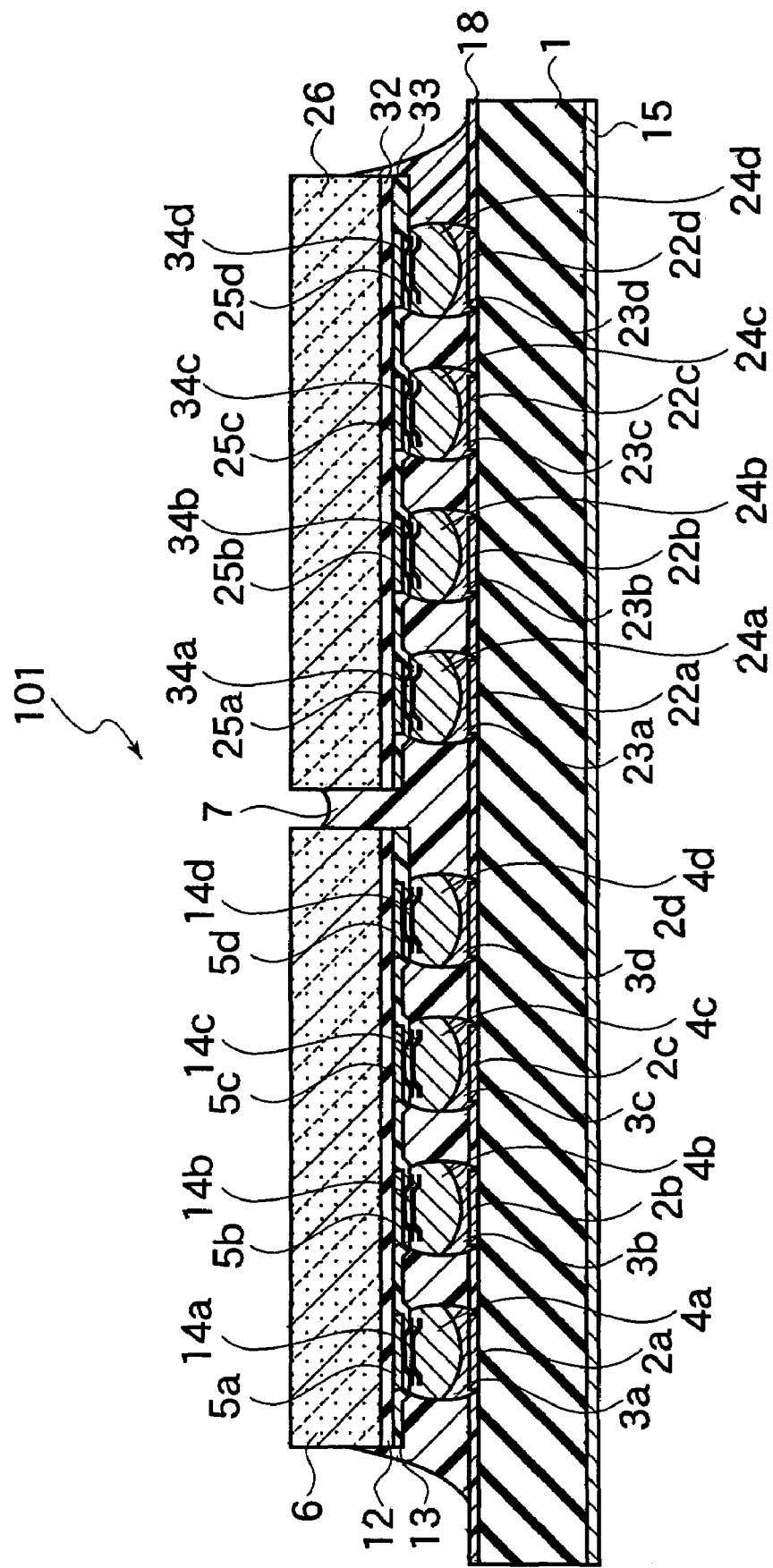
FIG. 13 is a sectional view showing a modification of the first level assembly according to a first embodiment of the present invention.

As shown in FIG. 13, a packaging assembly 101 according to a modification of the first embodiment of the present invention differs from the packaging assembly 100 shown in FIG. 1 in that the packaging assembly 101 further includes a plurality of second chip-site lands 22a, 22b, 22c, and 22d, a plurality of third solder balls 23a, 23b, 23c, and 23d connected to the second chip-site lands 22a, 22b, 22c, and 22d, a plurality of fourth solder balls 24a, 24b, 24c, and 24d connected to the third solder balls 23a, 23b, 23c, and 23d, and a second semiconductor chip 26 connected to the fourth solder balls 24a, 24b, 24c, and 24d. On the third surface of the semiconductor chip 26, a second low-k film 32 is disposed. A plurality of second bonding pads 25a, 25b, 25c, and 25d are aligned under the second low-k film 32. A second protective film 33 containing organic resin is formed on the surface of the second low-k film 32. Although, it is omitted in FIG. 13, a second circuit element are merged in the third surface or the second semiconductor chip 26, and second multilevel-interconnection having insulating films and metallic interconnections are disposed on the third surface of the semiconductor chip 26 as shown in FIG. 1A.

Detailed explanation is omitted regarding the second chip-site lands 22a, 22b, 22c, and 22d, the third solder balls 23a, 23b, 23c, and 23d, the fourth solder balls 24a, 24b, 25c, 25d, the second low-k film 32, the second chip-side internal connection pad 25a, 25b, 25c, and 25d, and the second protective film 33, which have the same organization as the chip-site lands 2a, 2b, 2c, and 2d, first solder balls 3a, 3b, 3c, and 3d, the second solder balls 4a, 4b, 4c, and 4d, the low-k film 12, the chip-side internal connection pad 5a, 5b, 5c, and 5d, and the protective film 33, respectively.

(Assembling Method of the Modification)

Figure 14:
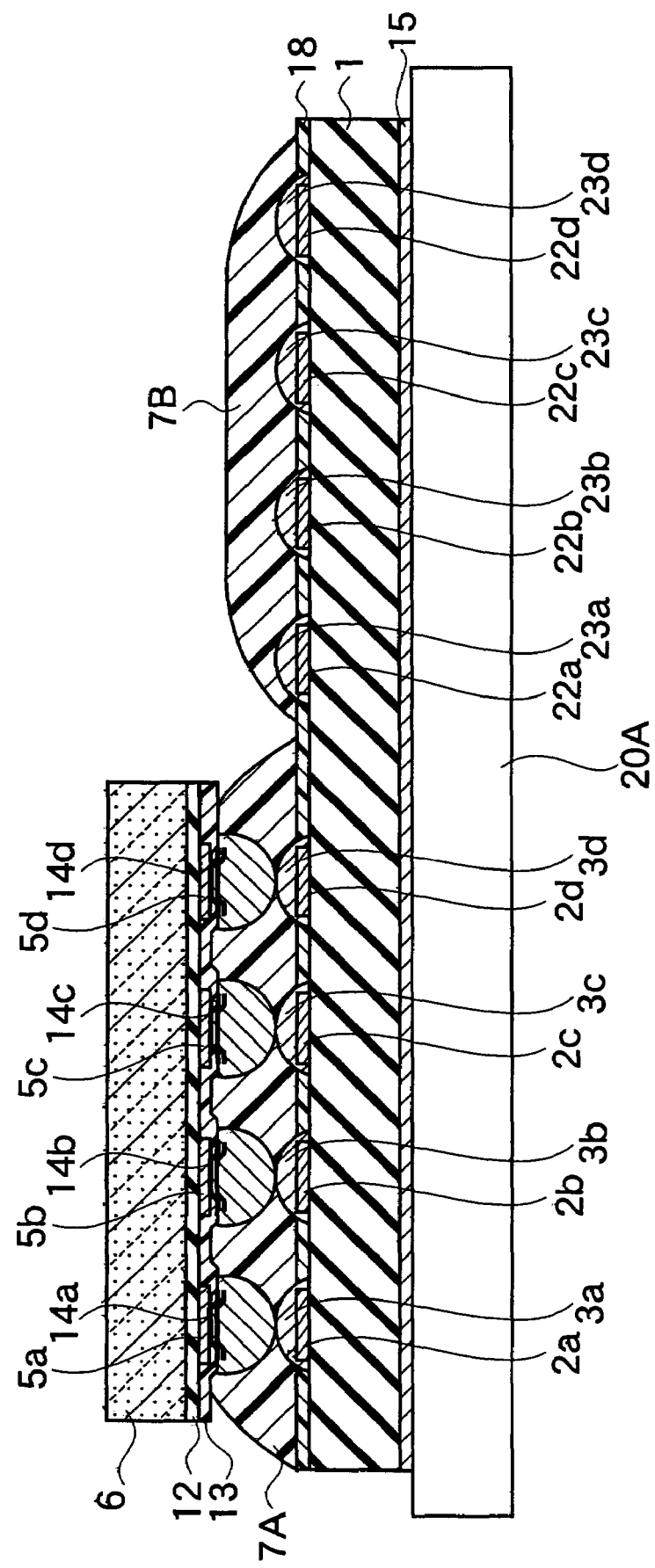
FIGS. 14 and 15 are sectional views showing an example of assembling the modification of the packaging assembly shown in FIG. 13 according to the first embodiment of the present invention.
Figure 15:
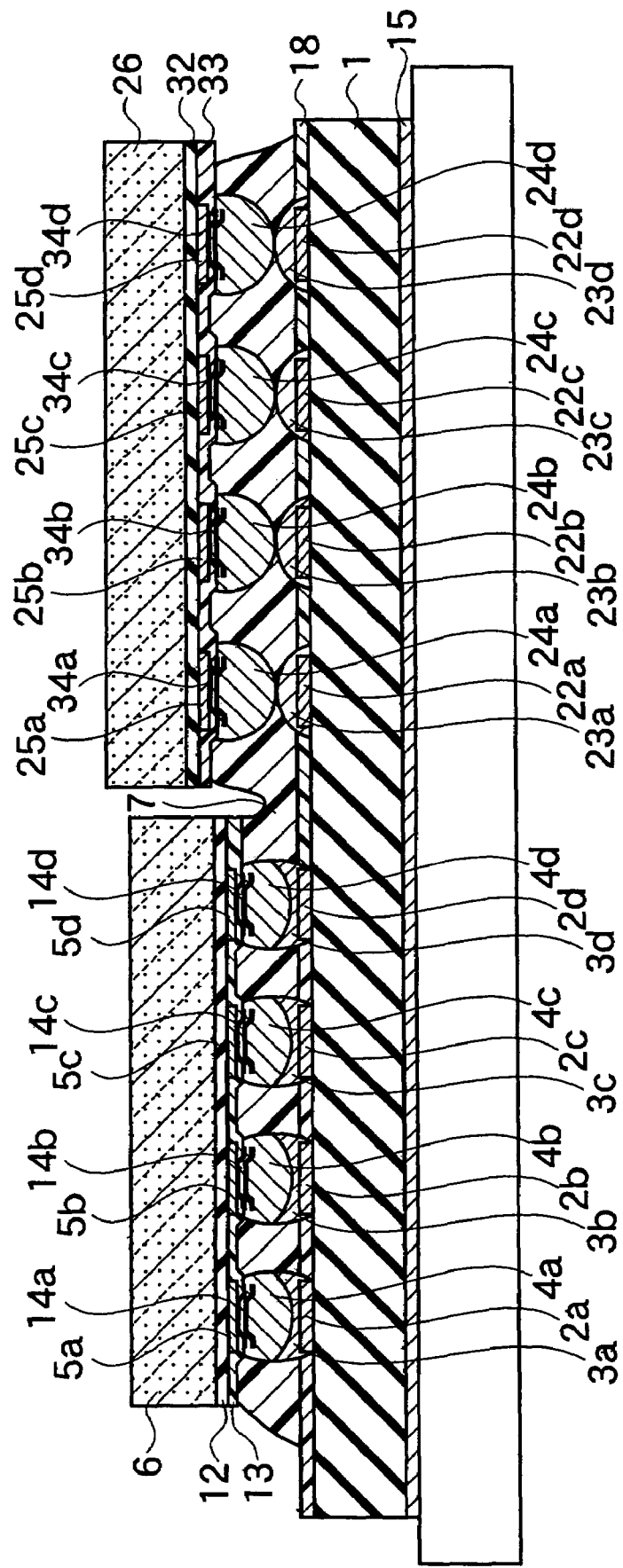

Next, as shown in FIGS. 13 to 15, an assembling method of the packaging assembly 101 according to the modification of first embodiment of the present invention is described.

(a) First, the substrate 1 which is made from epoxy resin with a thickness of 30 μm~60 μm is prepared. A wiring layer 15 made from copper is formed on the second surface of the substrate 1. On the first surface, the chip-site lands 2a, 2b, 2c, and 2d, and the second chip-site lands 22a, 22b, 22c, and 22d are formed. Then, the protective film 18 made from $SiO_2$ film, PSG film or the like is laminated on the chip-site lands 2a, 2b, 2c, and 2d, and the second chip-site lands 22a, 22b, 22c, and 22d. The protection film 18 is partially removed such that the chip-site lands 2a, 2b, 2c, and 2d, and the second chip-site lands 22a, 22b, 22c, and 22d are exposed. Thus, the first solder balls 3a, 3b, 3c, and 3d are formed on the chip-site lands 2a, 2b, 2d, and 2d. The third solder balls 23a, 23b, 23c, and 23d are formed on the second chip-site lands 22a, 22b, 22c, and 22d. Next, as shown in FIG. 14, the substrate 1 is disposed on the assembling stage 20A which is heated around 150° C.

(b) Next, underfill resin 7A serves as flux is applied on the second surface of the substrate 1 so as to surround the chip-site lands 2a, 2b, 2c, and 2d, and the first solder balls 3a, 3b, 3c, and 3d. Underfill resin (second underfill resin) 7B serves as flux is applied so as to surround the second chip-site lands 22a, 22b, 22c, and 22d, and the third solder balls 23a, 23b, 23c, and 23d. Then, underfill resins 7A and 7B are heated and activated by the heat of assembling stage 20A. As a result, oxides and impurities included on the surface of first solder balls 3a, 3b, 3c, and 3d and third solder balls 23a, 23b, 23c, 23d are removed by the underfill resins 7A and 7B serving as flux. After that, the surfaces of the first solder balls 3a, 3b, 3c, and 3d are exposed on the surface of the underfill resin 7A. The surface of the third solder balls 23a, 23b, 23c, and 23d are also exposed on the surface of the underfill resin 7B.

(c) Next, as shown in FIG. 14, the second solder balls 4a, 4b, 4c, and 4d are aligned on the first solder balls 3a, 3b, 3c, and 3d so as to be mated to each other, and pressurized by being pushed from the fourth surface of the semiconductor chip 6 toward the substrate 1. Then, the first solder balls 3a, 3b, 3c, and 3d are melted with heat from the assembling stage 20A and adhered to the around of second solder balls 4a, 4b, 4c, and 4d. Next, as shown in FIG. 15, the fourth solder balls 24a, 24b, 24c, and 24d connected with the second semiconductor chip 25 are aligned on the third solder balls 23a, 23b, 23c, and 23d so as to be mated each other, and pressurized by being pushed from fourth surface of the second semiconductor chip 26 toward the substrate 1. Then, the third solder balls 23a, 23b, 23c, and 23d are melted with heat from the assembling stage 20A and adhered to the around of fourth solder balls 24a, 24b, 24c, and 24d. Moreover, the assembling stage 20A and the assembling tool 20B are cooled, and the underfill resin 7 is cooled and hardened.

As described above, the packaging assembly 101 as shown in FIG. 13 can be manufactured. According to the packaging assembly 101 of the first embodiment of the present invention, the first solder balls 3a, 3b, 3c and 3d disposed on the chip-site lands 2a, 2b, 2c, and 2d melt with the heat from assembling stage 20A of about 150° C. to be connected temporarily to the second solder balls 4a, 4b, 4c, and 4d. Therefore, when second semiconductor chip 26 is mounted next to semiconductor chip 6, it can prevent the position of semiconductor chips 6 and 26 from shifting due to the flow of underfill resins 7A and 7B. Moreover, two or more semiconductor chips can be mounted adjacently. Since the packaging assembly 101 shown in FIG. 13 can be mounted at a low temperature of 150° C., gas is not released from the substrate 1, and voids are not generated in the underfill resin 7 even if an organic synthetic resin is used for a material of the substrate 1. Furthermore, since heat expansion of the substrate 1 and semiconductor chips 6 and 26, and heat contraction of the underfill resin 7 can be suppressed at lower level, strong thermal stresses are not be incurred to bonding pads 5a, 5b, 5c, and 5d, and second bonding pads 25a, 25b, 25c, and 25d. Therefore, thermal stresses applied to the low-k film 12 and second low-k film 32 which are disposed close to the bonding pads 5a, 5b, 5c, and 5d, and second bonding pads 25a, 25b, 25c, and 25d, can be minimized and breakage of the films can be prevented.

Second Embodiment

Figure 16:
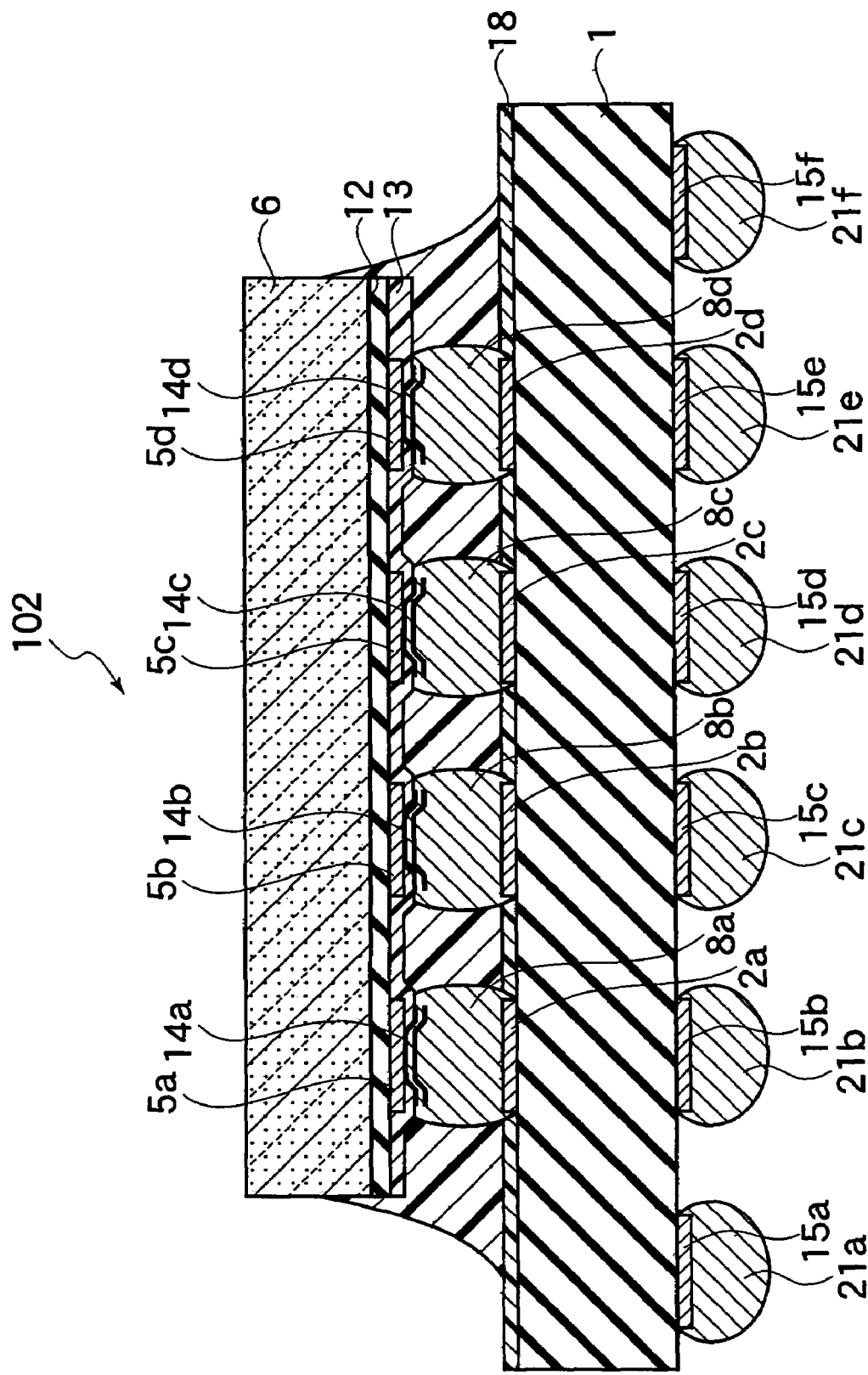
FIG. 16 is a sectional view showing an example of packaging assembly according to a second embodiment of the present invention.

The packaging assembly 102 according to a first embodiment of the present invention encompasses, as shown in FIG. 16, a plurality of internal solder joints 8a, 8b, 8c, and 8d disposed between chip-site lands 2a, 2b, 2c, and 2d, and bonding pads 5a, 5b, 5c, and 5d. On the second surface of the substrate 1, a plurality of external lands 15a, 15b, 15c, and 15d are disposed. A plurality of external solder balls 21a, 21b, 21c, and 21d are connected on the external lands 15a, 15b, 15c, and 15d, respectively. Others are the same as a packaging assembly 100 shown in FIG. 1, detailed explanations are omitted.

The internal solder joints 8a, 8b, 8c, and 8d are electrodes mixed with first solder balls 3a, 3b, 3c, and 3d and second solder balls 4a, 4b, 4c, and 4d as shown in FIG. 1. The internal solder joints 8a, 8b, 8c, and 8d have higher melting temperature than first solder balls 3a, 3b, 3c, and 3d, and have lower melting temperature than second solder balls 4a, 4b, 4c, and 4d. As for the internal solder joints 8a, 8b, 8c, and 8d, at least two kinds of solder materials having higher and lower melting temperatures can be included. For solder materials having lower melting temperature, Sn—Bi alloys, Sn—Bi—Ag alloys, Sn—Zn alloys, Sn—Zn—Bi alloys, An—Bi—In alloys, Bi—In alloy, Sn—In alloys, In—Ag alloys, Sn—Pb (Sn=5 w %, Pb=95 w %) can be used. For the materials having higher melting temperature, for example, Sn—Ag alloys, Sn—Ag—Cu alloys, Sn—Pb (Sn—=63 w %, Pb=37 w %) alloys, and Sn—Zn alloys can be used.

As for the external lands 15a, 15b, 15c, and 15d, conductive material such as aluminum (Al,) aluminum alloy (Al—Si, Al—Cu—Si), gold, copper, or the like can be used. Alternatively, other electrodes can be provided through a plurality of signal lines such as gate wires connected to a plurality of polysilicon gate electrodes. Instead of gate electrodes made from polysilicon, it is possible to use gate electrodes made from a metal having a higher melting temperature including W, Ti, and Mo, silicides thereof (WSi$_2$, TiSi$_2$ and MoSi$_2$), polycide using these silicides, or the like. Furthermore, it is also possible to mount a motherboard or the like on the external lands 15a, 15b, 15c, and 15d.

As for the external solder balls 21a, 21b, 21c, and 21d, solder materials having higher melting temperature than the first solder balls 3a, 3b, 3c, and 3d can be used. As for the external solder balls 21a, 21b, 21c, and 21d, materials selected from a Sn—Ag alloy, Sn—Ag—Cu alloy, Sn—Pb (Sn=63 w % Pb=35 w %) alloy, Sn—Zn alloy can be used. Mixtures or compounds made from materials such as Au, Ag, Cu, Ni, Fe, Pd, Sn, Pb, Ag, Bi, Zn, In, Sb, Cu, Ge can be also used.

Assembling Method of the Second Embodiment

Figure 17:
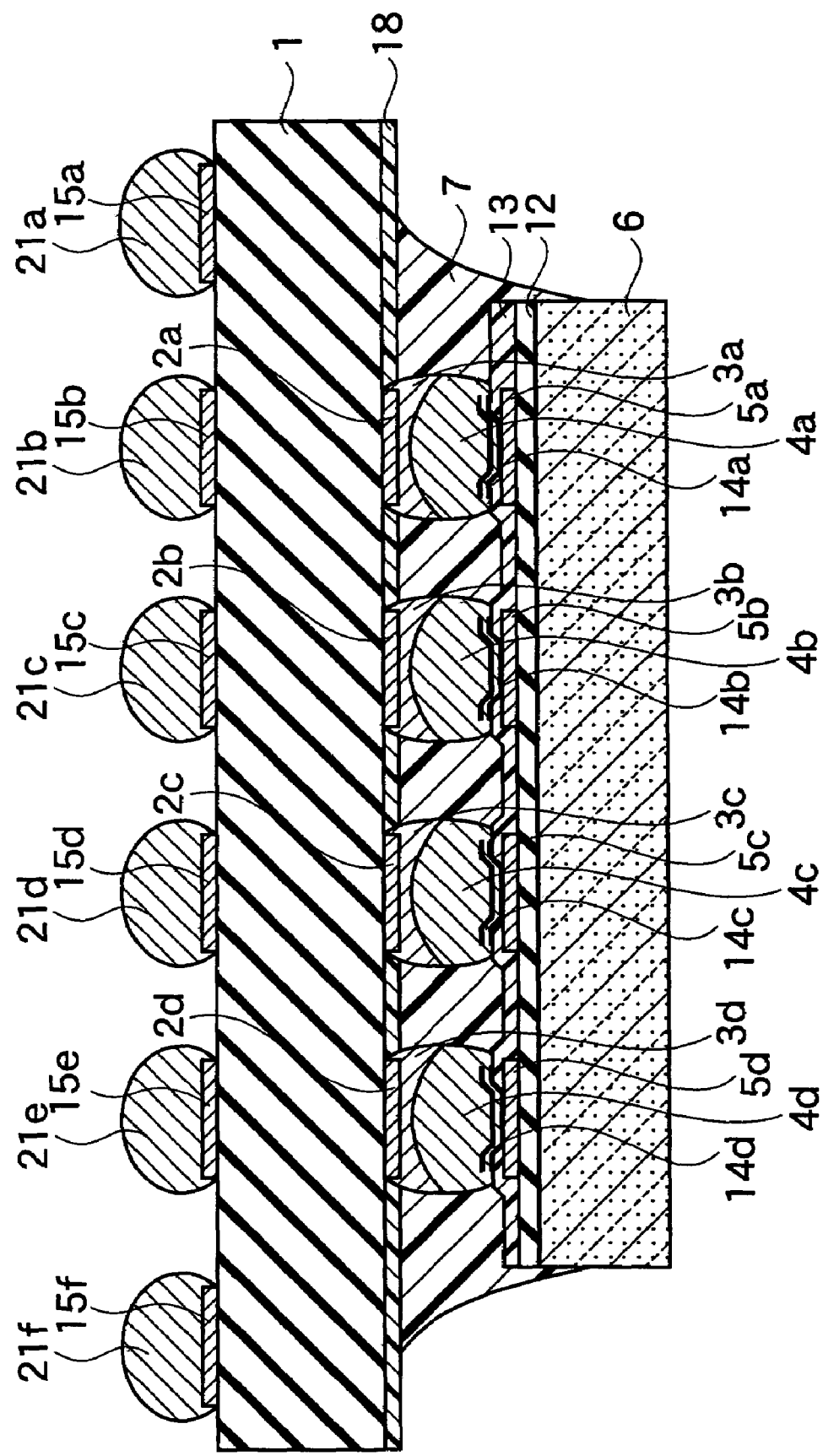
FIGS. 17 and 18 are sectional views showing an example of assembling the packaging assembly according to the second embodiment of the present invention.
Figure 18:
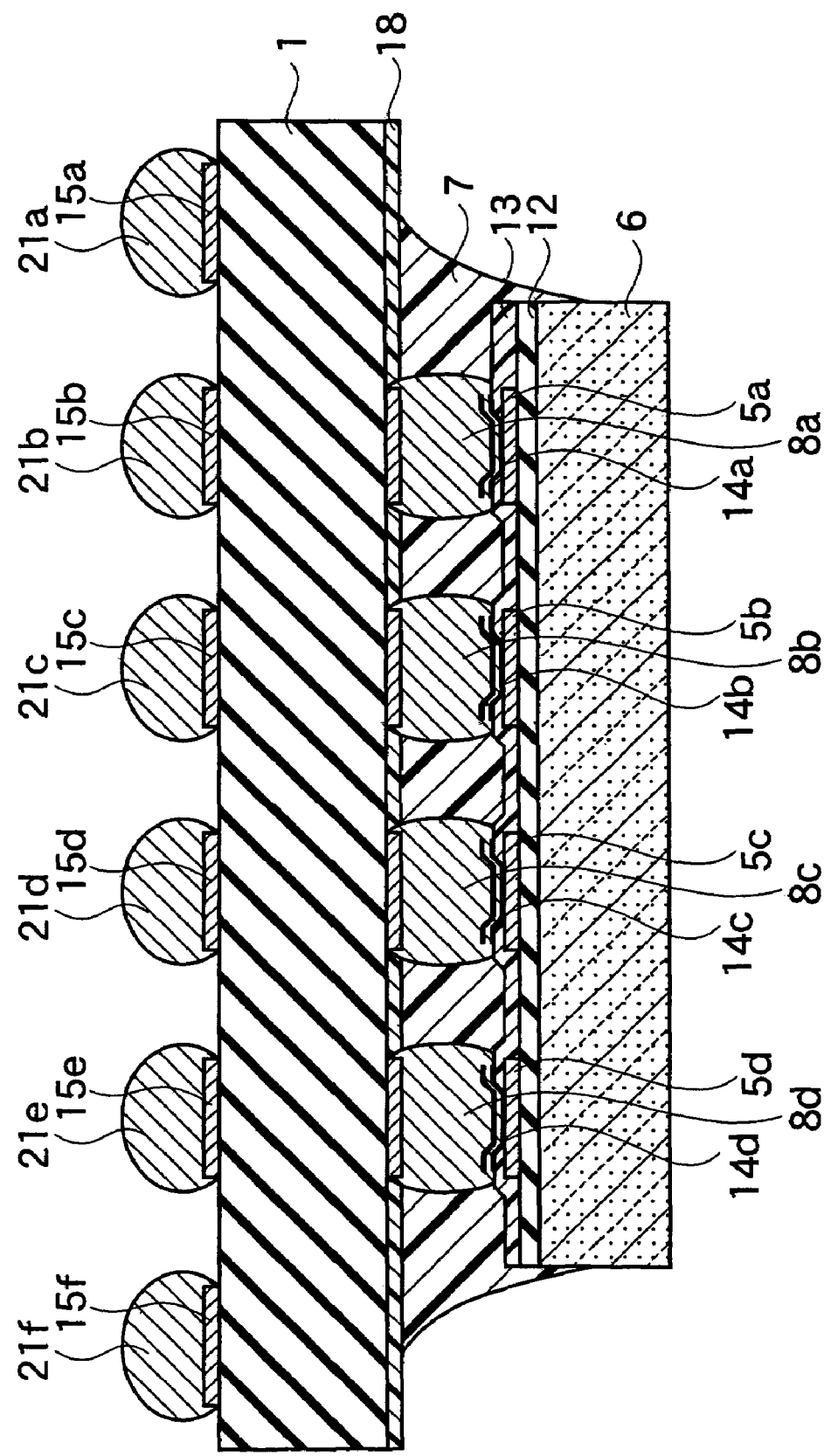

Next, as shown in FIGS. 17 and 18, an assembling method of the packaging assembly 102 according to the second embodiment of the present invention is described. Here, since the second assembling method before forming second solder balls 4a, 4b, 4c, and 4d on the semiconductor chip 6 or first solder balls 3a, 3b, 3c, and 3d on the substrate 1 is substantially the same shown in FIGS. 2~8, detailed explanation is omitted.

A photo resist film (not shown) is coated on the wiring layer 15 (shown in FIG. 1) delineated on the second surface by use of photolithography technology. The wiring layer 15 is partially delineated with the photo resist film as an etching mask, and external lands 15a, 15b, 15c, and . . . 15d are formed. A protective film (not shown) which is made from SiO$_2$, SiN and the like can be delineated so as to be surround the external lands 15a, 15b, 15c, and 15d. Then, as shown in FIG. 17, the external solder balls 21a, 21b, 21c, and 21d containing such as Sn—Ag alloys are formed on the external lands 15a, 15b, 15c, and 15d, and heated around 200° C., reflow is performed. Heat from performing reflow is conveyed to first solder balls 3a, 3b, 3c, and 3d, and second solder balls 4a, 4b, 4c, and 4d. As a result, first solder balls 3a, 3b, 3c, and 3d, and second solder balls 4a, 4b, 4c, and 4d are melted to be formed internal solder joints 8a, 8b, 8c, and 8d. Since the internal solder joints 8a, 8b, 8c, and 8d are formed from a mixture of first solder balls 3a, 3b, 3c, and 3d, and second solder balls 4a, 4b, 4c, and 4d, the internal solder joints 8a, 8b, 8c, and 8d have higher melting temperature than first solder balls 3a, 3b, 3c, and 3d, and have lower melting temperature than second solder balls 4a, 4b, 4c, and 4d.

As described above, the packaging assembly 102 shown in FIG. 16 can be manufactured. According to the packaging assembly 102 of the second embodiment of the present invention, the first solder balls 3a, 3b, 3c and 3d melt at a heat of about 150° C. and connect temporarily to the second solder balls 4a, 4b, 4c, and 4d. Therefore, when an organic synthetic resin is used for a material of the substrate 1, gas is not released from the substrate 1, and voids are not generated in the underfill resin 7. Moreover, since the substrate 1 and the semiconductor chip 6 are connected at a low temperature, thermal stresses applied to the low-k film 12 disposed on the bonding pads 5a, 5b, 5c, and 5d can be minimized. Furthermore, since complete connection is accomplished by forming internal solder joints 8a, 8b, 8c, and 8d to be heated by reflowing process, the reliability of the first level assembly 102 can be improved. Accordingly, internal solder joints 8a, 8b, 8c, and 8d do not melt even if in a test of a continuous at high temperature of 150° C., or a heat cycle test which repeatedly varies an atmosphere from 120° C. to −55° C.

Modification of the Second Embodiment

Figure 19:
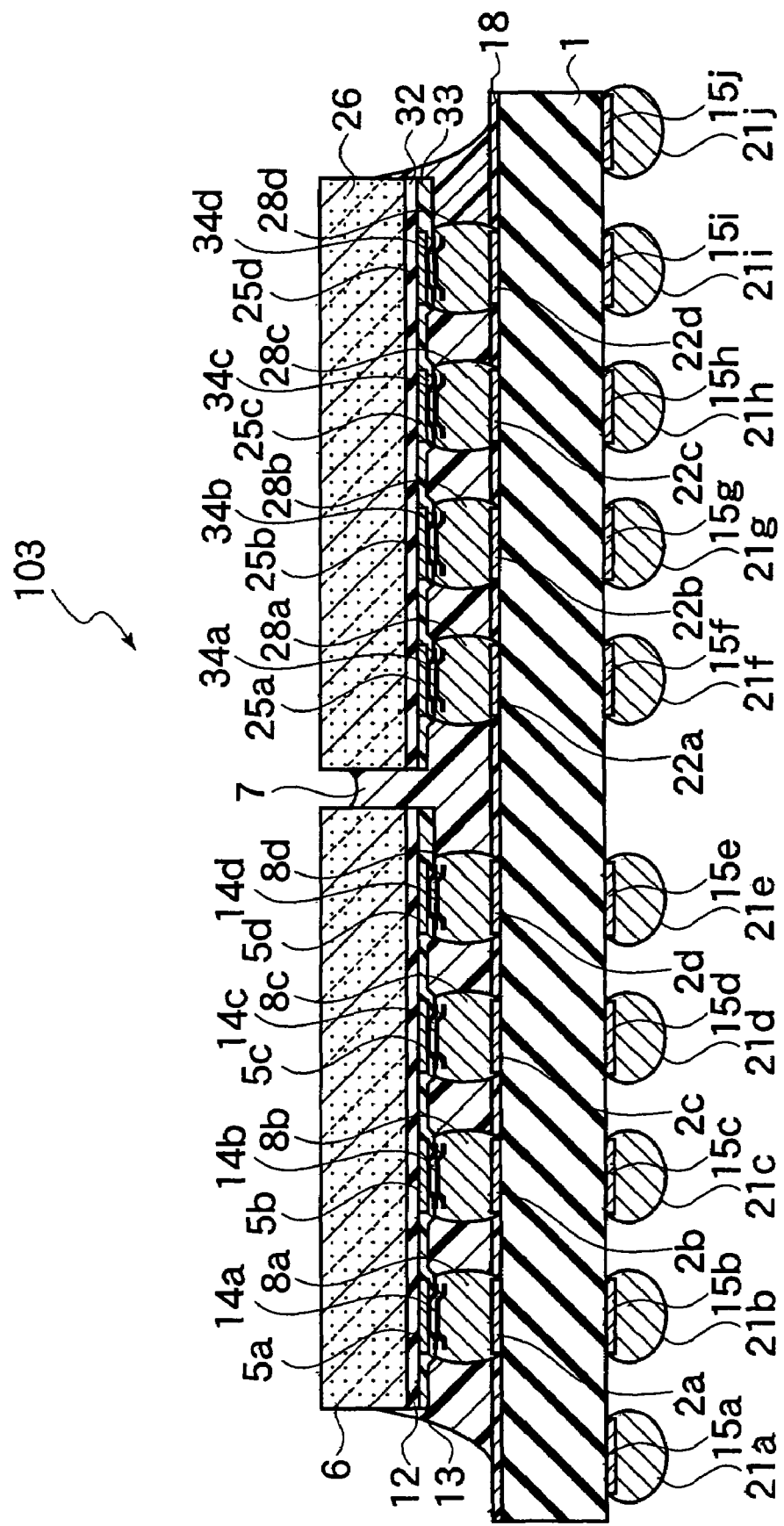

The packaging assembly 103 according to a second embodiment of the present invention encompasses, as shown in FIG. 19, a plurality of second internal solder joints 28a, 28b, 28c, and 28d are disposed between second chip-site lands 22a, 22b, 22c, and 22d, and second bonding pads 25a, 25b, 25c, and 25d. A plurality of external lands 15a, 15b, 15c, . . . , 15j are disposed on the first surface opposite to the second chip-site lands 22a, 22b, 22c, and 22d. A plurality of external solder ball 21a, 21b, 21c, . . . , 21j are connected on the external lands 15a, 15b, 15c, . . . , 15j, respectively. Others are the same as a packaging assembly 101 shown in FIG. 13, explanations are omitted.

The second internal solder joints 28a, 28b, 28c, and 28d are electrodes mixed with third solder balls 23a, 23b, 23c, and 23d, and fourth solder balls 24a, 24b, 24c, and 24d as shown in FIG. 20. The second internal solder joints 28a, 28b, 28c, and 28d have higher melting temperature than third solder balls 23a, 23b, 23c, and 23d, and have lower melting temperature than fourth solder balls 24a, 24b, 24c, and 24d. As for the second internal solder joints 28a, 28b, 28c, and 28d, at least two kinds of solder materials having higher melting temperature and lower melting temperature can be used. For solder materials of lower melting temperature, Sn—Bi alloys, Sn—Bi—Ag alloys, Sn—Zn alloys, Sn—Zn—Bi alloys, Sn—Bi—In alloys, Bi—In alloy, Sn—In alloys, In—Ag alloys, Sn—Pb (Sn=5 w %, Pb=95 w %) can be used. Materials of higher melting temperature, for example, Sn—Ag alloys, Sn—Ag—Cu alloys, Sn—Pb (Sn—=63 w %, Pb=37 w %) alloys, and Sn—Zn alloys can be used.

Assembling Method

Next, as shown in FIGS. 19 and 20, an assembling method of the packaging assembly 103 according to the modification of the second embodiment of the present invention is described.

A photo resist film (not shown) is delineated on the wiring layer 15 formed on the second surface by use of photolithography technology. The wiring layer 15 is stripped with the photo resist film as an etching mask, external lands 15a, 15b, 15c, . . . , 15j are formed. A protective film which is made from SiO$_2$, SiN and the like can be formed so as to surround the external lands 15a, 15b, 15c, and . . . , 15j. Then, as shown in FIG. 20, the outer connection solder balls 21a, 21b, 21c, . . . , 21j containing such as Sn—Ag alloys are formed on the external lands 15a, 15b, 15c, . . . , 15j and heated around 200° C., reflow is performed. Heat from performing reflow is conveyed to first and third solder balls 3a, 3b, 3c, d 3d, 23a, 23b, 23c, and 23d, and second and fourth solder balls 4a, 4b, 4c, 4d, and 24a, 24b, 24c, and 24d. As a result, first and third solder balls 3a, 3b, 3c, 3d, 23a, 23b, 23c, and 23d, and second and fourth solder balls 4a, 4b, 4c, 4d, 24a, 24b, 24c, and 24d are melted to be formed internal solder joints 8a, 8b, 8c, and 8d and second internal solder joints 28a, 28b, 28c, and 28d.

As described above, the packaging assembly 103 as shown in FIG. 19 can be assembled. According to the packaging assembly 103 of the modification of second embodiment of the present invention, third solder balls 23a, 23b, 23c, and 23d, and fourth solder balls 24a, 24b, 24c, and 24d are connected temporarily after being connected with first solder balls 3a, 3b, 3c, and 3d and second solder balls 4a, 4b, 4c, and 4d. Therefore, when the second semiconductor chip 26 is mounted next to the first semiconductor chip 6, shifting of the position of chips 6 and 26 caused by the flow of underfill resin 7 can be prevented. Moreover, two or more semiconductor chips can be mounted adjacently. Since the packaging assembly 103 shown in FIG. 19 can be mounted at a low temperature of 150° C., gas is not released from the substrate 1, and not generated in the underfill resin 7 even if an organic synthetic resin is used for a material of the substrate 1. Furthermore, since heat expansion of the substrate 1 and semiconductor chips 6 and 26, and heat contraction of the underfill resin 7 can be suppressed at lower level, strong thermal stresses are not be incurred to bonding pads 5a, 5b, 5c, and 5d, and second bonding pads 25a, 25b, 25c, and 25d. Therefore, thermal stresses applied to the low-k film 12 and second low-k film 32 which are disposed close to the bonding pads 5a, 5b, 5c, and 5d, and second bonding pads 25a, 25b, 25c, and 25d, can be minimized and the breakage of the films can be prevented. Furthermore, since complete connection is accomplished by forming internal solder joints 8a, 8b, 8c, and 8d, and second internal solder joints 28a, 28b, 28c, and 28d, to be heated by reflowing process, the reliability of the first level assembly 102 can be improved. Accordingly, first and second internal solder joints 8a, 8b, 8c, 8d, 28a, 28b, 28c, and 28d do not melt even if in a test of a continuous at high temperature of 150° C., or a heat cycle test which repeatedly varies an atmosphere from 120° C. to −55° C.

Other Embodiments

Various modifications will become possible for those skilled in the art upon receiving the teachings of the present disclosure without departing from the scope thereof.

As for the packaging assembly 100, 101, 102, and 103 shown in FIGS. 1–19, materials of the solder balls 3a–3d, 4a–4d, 23a–23d, 24a–24d can be partially changed. When the solder balls 3a–3d, 4a–4d, 23a–23d, 24a–24d are heated by performing reflowing, the semiconductor chips 6 and 26 and substrate 1 are elongated respectively. The thermal stresses caused by heat expansion (elongation) occurring at the central parts of the semiconductor chips 6 and 26 or the substrate 1 are weak. However, thermal stresses occurring at the edges of the semiconductor chips 6 and 26 and the substrate 1 are strong. Therefore, lead-free solders having higher melting temperature can be applied to the second solder joints 4b and 4c. The lead-free solders having lower melting temperatures can be applied to the second solder joints 4a and 4d. Accordingly, it is possible to prevent the breakage of materials that have weak mechanical strengths formed in the circuit elements of the semiconductor chip 6, particularly, the breakage of the low-k film 12 disposed directly on the second solder joints 4a, 4b, 4c, and 4d.

What is claimed is:

1. A method of assembling a packaging assembly comprising:
    preparing a substrate having a plurality of chip-site lands disposed on a first surface of a substrate;
    disposing a plurality of first solder balls on the chip-site lands;
    applying an underfill resin around the chip-site lands and the first solder balls;
    preparing a semiconductor chip having:
        a plurality of semiconductor elements provided on a surface,
        a plurality of low dielectric constant films stacked on the surface, each of the low dielectric constant films having an effective dielectric constant of equal to or less than 3.5, and
        a plurality of metallic interconnections stacked with the low dielectric constant films, with coherence strength of the low dielectric constant films to the semiconductor elements and the metallic interconnections being equal to or less than 15 J/m$^2$;
    disposing a plurality of second solder balls on corresponding bonding pads disposed on the semiconductor chip;
    aligning the first solder balls with corresponding second solder balls;
    connecting the first and second solder balls by melting the first solder balls; and
    hardening the underfill resin.

2. The method of claim 1, wherein connecting the first and second solder balls includes disposing the substrate on an assembling stage heated to around 150° C. before melting the first solder balls with a transferred heat from the assembling stage.

3. The method of claim 1, wherein preparing the substrate prepares the substrate having the chip-site lands and a plurality of second chip-site lands, the method further comprising:
    disposing a plurality of third solder balls on the second chip-site lands;
    applying a second underfill resin around the second chip-site lands and the third solder balls;
    disposing a plurality of fourth solder balls on corresponding bonding pads disposed on a second semiconductor chip;
    aligning the third solder balls with corresponding fourth solder balls after connecting the first and second solder balls;
    connecting the third and fourth solder balls by melting the third solder balls; and
    hardening the second underfill resin.

4. The method of claim 1, further comprising:
    disposing a plurality of external solder balls on corresponding external lands disposed on the second surface of the substrate after hardening the underfill resin; and
    forming a plurality of internal solder joints from first and second solder balls by melting.

5. The method of claim 4, wherein the internal solder joints are formed of at least one material selected from the group of alloys consisting of Sn—Bi, Sn—Bi—Ag, Sn—Zn, Sn—Zn—Bi, Sn—Bi—In, Bi—In, Sn—In, Bi—Pd, In—Ag, Sn—Ag, Sn—Ag—Cu, and Sn—Pb.

6. The method of claim 1, further comprising applying a protective film containing an organic synthetic resin on the surface of the semiconductor chip before disposing the second solder balls.

* * * * *